US012588343B2

(12) United States Patent
Song et al.

(10) Patent No.: US 12,588,343 B2
(45) Date of Patent: Mar. 24, 2026

(54) DISPLAY DEVICE

(71) Applicant: Samsung Display Co., LTD., Yongin-si (KR)

(72) Inventors: Myeong Hun Song, Yongin-si (KR); Jang Soon Park, Yongin-si (KR); Sung Geun Bae, Yongin-si (KR); Tae Hee Lee, Yongin-si (KR); Hyun Wook Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 18/453,181

(22) Filed: Aug. 21, 2023

(65) Prior Publication Data

US 2024/0072229 A1    Feb. 29, 2024

(30) Foreign Application Priority Data

Aug. 26, 2022    (KR) ........................ 10-2022-0107449

(51) Int. Cl.
  H10H 20/857    (2025.01)
  H01L 25/075    (2006.01)
  H10H 20/831    (2025.01)
(52) U.S. Cl.
  CPC ....... H10H 20/857 (2025.01); H01L 25/0753 (2013.01); H10H 20/831 (2025.01)
(58) Field of Classification Search
  CPC .. H10H 20/831; H10H 20/0364; H10H 20/01; H10H 20/819; H10H 20/85; H10H 29/142; H10H 20/857; H01L 25/167; H01L 25/0753; H10D 86/441
  See application file for complete search history.

(56) References Cited

U.S. PATENT DOCUMENTS

| | | | |
|---|---|---|---|
| 12,219,823 B2 * | 2/2025 | Kim ..................... | H10K 59/124 |
| 2022/0140194 A1 * | 5/2022 | Song ................. | H10H 20/8312 |
| | | | 257/40 |
| 2022/0140196 A1 * | 5/2022 | Kim ..................... | H10H 20/857 |
| | | | 257/79 |
| 2022/0302235 A1 * | 9/2022 | Kim ..................... | H10H 20/857 |
| 2022/0320378 A1 * | 10/2022 | Hong ................. | H01L 25/0753 |

(Continued)

FOREIGN PATENT DOCUMENTS

KR    10-2020-0014955 A    2/2020

*Primary Examiner* — Victor A Mandala
(74) *Attorney, Agent, or Firm* — Womble Bond Dickinson (US) LLP

(57) ABSTRACT

A display device includes: light emitting elements, each of the light emitting elements including a first end having a first polarity and a second end having a second polarity different from the first polarity; and a first type connection electrode contacting the first ends and/or the second ends of the light emitting elements, wherein a first type connection electrode includes: a middle portion extending in a first direction; a first electrode portion extending from the middle portion toward a first side in a second direction intersecting the first direction; a second electrode portion extending from the middle portion toward the first side in the second direction and spaced from the first electrode portion by a first width in the first direction; a third electrode portion extending from the middle portion toward a second side in the second direction; and a fourth electrode portion.

20 Claims, 18 Drawing Sheets

(56)         References Cited

U.S. PATENT DOCUMENTS

| | | | | |
|---|---|---|---|---|
| 2022/0328558 | A1* | 10/2022 | Kim | H10H 20/821 |
| 2022/0359790 | A1* | 11/2022 | Lee | H01L 25/167 |
| 2023/0120255 | A1* | 4/2023 | Woo | H01L 24/24 |
| | | | | 257/104 |
| 2023/0230967 | A1* | 7/2023 | Kim | H10D 86/441 |
| | | | | 257/91 |
| 2023/0282777 | A1* | 9/2023 | Moon | H10H 20/819 |
| | | | | 257/79 |
| 2023/0352626 | A1* | 11/2023 | Nam | H10H 20/857 |
| 2023/0361259 | A1* | 11/2023 | Yun | H01L 25/167 |
| 2023/0378141 | A1* | 11/2023 | Kim | H01L 25/0753 |
| 2023/0420618 | A1* | 12/2023 | Kim | H01L 25/16 |
| 2024/0038937 | A1* | 2/2024 | Basrur | H01L 25/0753 |
| 2024/0047506 | A1* | 2/2024 | Shim | H10H 20/84 |
| 2024/0063327 | A1* | 2/2024 | Kim | H10H 29/142 |
| 2024/0222583 | A1* | 7/2024 | Im | H01L 25/167 |
| 2024/0274645 | A1* | 8/2024 | Kim | H10H 20/84 |

* cited by examiner

SPXn: SPX1, SPX2, SPX3

RME: RME1, RME2, RME3
CNE: CNE1, CNE2, CNE3, CNE4, CNE5

ED: ED1, ED2, ED3, ED4
EA1: EA1a, EA1b
EA2: EA2a, EA2b
EA3: EA3a, EA3b
EA4: EA4a, EA4b
RME: RME1, RME2, RME3
CNE: CNE1, CNE2, CNE3,
     CNE4, CNE5
CNE1: CNE1a, CNE1b,
       CNE1c, CNE1d
CNE2: CNE2a, CNE2b,
       CNE2c, CNE2d, CNE2e
CNE3: CNE3a, CNE3b,
       CNE3c, CNE3d, CNE3e
CNE4: CNE4a, CNE4b,
       CNE4c, CNE4d, CNE4e
CNE5: CNE5a, CNE5b,
       CNE5c, CNE5d

ED: ED1, ED2, ED3, ED4
EA1: EA1a, EA1b
EA2: EA2a, EA2b
EA3: EA3a, EA3b
EA4: EA4a, EA4b
RME: RME1, RME2, RME3
CNE: CNE1,CNE2, CNE3,
     CNE4, CNE5
CNE1: CNE1a, CNE1b,
      CNE1c, CNE1d
CNE2: CNE2a, CNE2b,
      CNE2c, CNE2d, CNE2e
CNE3: CNE3a, CNE3b,
      CNE3c, CNE3d, CNE3e
CNE4: CNE4a, CNE4b,
      CNE4c, CNE4d, CNE4e
CNE5: CNE5a, CNE5b,
      CNE5c, CNE5d

ED: ED1, ED2, ED3, ED4
EA1: EA1a, EA1b
EA2: EA2a, EA2b
EA3: EA3a, EA3b
EA4: EA4a, EA4b
RME_2: RME1, RME2_2, RME3
RME2_2: RME2a, RME2b
CNE: CNE1, CNE2, CNE3,
       CNE4, CNE5
CNE1: CNE1a, CNE1b,
       CNE1c, CNE1d
CNE2: CNE2a, CNE2b,
       CNE2c, CNE2d, CNE2e
CNE3: CNE3a, CNE3b,
       CNE3c, CNE3d, CNE3e
CNE4: CNE4a, CNE4b,
       CNE4c, CNE4d, CNE4e
CNE5: CNE5a, CNE5b,
       CNE5c, CNE5d

ED: ED1, ED2
EA1: EA1a, EA1b
EA2: EA2a, EA2b
RME: RME1, RME2, RME3
CNE_3: CNE1,CNE2, CNE3_3
CNE1: CNE1a, CNE1b,
          CNE1c, CNE1d
CNE2: CNE2a, CNE2b,
          CNE2c, CNE2d, CNE2e
CNE3_3: CNE3_3a, CNE3_3b,
          CNE3_3c, CNE3_3d

ED: ED1, ED2, ED3, ED4,
    ED5, ED6
EA1: EA1a, EA1b
EA2: EA2a, EA2b
EA3: EA3a, EA3b
EA4: EA4a, EA4b
EA5: EA5a, EA5b
EA6: EA6a, EA6b
RME: RME1, RME2, RME3
CNE_4: CNE1, CNE2, CNE3,
    CNE4, CNE5_4, CNE6, CNE7
CNE1: CNE1a, CNE1b,
    CNE1c, CNE1d
CNE2: CNE2a, CNE2b,
    CNE2c, CNE2d, CNE2e
CNE3: CNE3a, CNE3b,
    CNE3c, CNE3d, CNE3e
CNE4: CNE4a, CNE4b,
    CNE4c, CNE4d, CNE4e
CNE5_4: CNE5_4a, CNE5_4b,
    CNE5_4c, CNE5_4d, CNE5_4e
CNE6: CNE6a, CNE6b,
    CNE6c, CNE6d, CNE6e
CNE7: CNE7a, CNE7b,
    CNE7c, CNE7d

DISPLAY DEVICE

CROSS-REFERENCE TO RELATED APPLICATION

This application claims priority to and the benefit of Korean Patent Application No. 10-2022-0107449, filed on Aug. 26, 2022, in the Korean Intellectual Property Office, the entire disclosure of which is incorporated by reference herein.

BACKGROUND

1. Field

The present disclosure relates to a display device and a method of manufacturing the display device.

2. Description of the Related Art

Display devices are becoming increasingly important with the development of multimedia. Accordingly, various types of display devices such as organic light emitting displays and liquid crystal displays are being used.

A display device includes a display panel such as an organic light emitting display panel or a liquid crystal display panel as a device for displaying an image of the display device. Among them, a light emitting display panel may include light emitting elements such as light emitting diodes (LEDs). For example, the LEDs may be organic light emitting diodes (OLEDs) using an organic material as a fluorescent material or may be inorganic LEDs using an inorganic material as a fluorescent material.

Inorganic LEDs using an inorganic semiconductor as a fluorescent material are durable even in a high-temperature environment and have higher blue light efficiency than OLEDs.

SUMMARY

Aspects and features of embodiments of the present disclosure provide a display device in which lighting reliability of pixels is improved.

However, aspects and features of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes: a plurality of light emitting elements, each of the plurality of light emitting elements including a first end having a first polarity and a second end having a second polarity different from the first polarity; and a first type connection electrode contacting the first ends and/or the second ends of the light emitting elements, wherein the first type connection electrode includes: a middle portion extending in a first direction; a first electrode portion extending from the middle portion toward a first side in a second direction intersecting the first direction; a second electrode portion extending from the middle portion toward the first side in the second direction and spaced from the first electrode portion by a first width in the first direction; a third electrode portion extending from the middle portion toward a second side in the second direction; and a fourth electrode portion extending from the middle portion toward the second side in the second direction and spaced from the third electrode portion by a second width in the first direction, wherein the first width is greater than the second width, and a space between the first electrode portion and the second electrode portion overlaps a space between the third electrode portion and the fourth electrode portion in the second direction.

In one or more embodiments, a display device may further include, a second type connection electrode configured to apply a first power supply voltage to the first end of at least one of the plurality of light emitting elements; and a third type connection electrode configured to apply a second power supply voltage having a different potential value from the first power supply voltage to the second end of at least one of the plurality of light emitting elements, wherein the second type connection electrode and the third type connection electrode are spaced from each other in the second direction, and the first type connection electrode is between the second type connection electrode and the third type connection electrode.

In one or more embodiments, the first type connection electrode including the first type connection electrodes repeatedly arranged along the second direction in the space between the second type connection electrode and the third type connection electrode.

In one or more embodiments, the first type connection electrodes include a first connection electrode and a second connection electrode neighboring the first connection electrode in the second direction, wherein a third electrode portion and a fourth electrode portion of the first connection electrode are between a first electrode portion and a second electrode portion of the second connection electrode, the third electrode portion of the first connection electrode faces the first electrode portion of the second connection electrode in the first direction, and the fourth electrode portion of the first connection electrode faces the second electrode portion of the second connection electrode in the first direction.

In one or more embodiments, the first connection electrode and the second connection electrode are at different layers.

In one or more embodiments, the first connection electrode and the second connection electrode are alternately and repeatedly arranged along the second direction.

In one or more embodiments, the second type connection electrode includes: a first power portion configured to receive the first power supply voltage; and a first electrode portion and a second electrode portion branching from the first power portion, extending in the second direction, and spaced from each other in the first direction.

In one or more embodiments, the third type connection electrode includes: a second power portion configured to receive the second power supply voltage; and a first electrode portion and a second electrode portion branching from the second power portion, extending in the second direction, and spaced from each other in the first direction.

In one or more embodiments, a distance between the first electrode portion and the second electrode portion of the second type connection electrode is equal to the second width, and a distance between the first electrode portion and the second electrode portion of the third type connection electrode is equal to the first width.

In one or more embodiments, the first type connection electrodes include a first connection electrode, wherein the first electrode portion and the second electrode portion of the second type connection electrode are between a first electrode portion and a second electrode portion of the first connection electrode, the first electrode portion of the first connection electrode faces the first electrode portion of the second type connection electrode, and the second electrode portion of the first connection electrode faces the second electrode portion of the second type connection electrode.

In one or more embodiments, the first type connection electrodes further include a second connection electrode spaced from the first connection electrode in the second direction, wherein a third electrode portion and a fourth electrode portion of the second connection electrode are between the first electrode portion and the second electrode portion of the third type connection electrode, the third electrode portion of the second connection electrode faces the first electrode portion of the third type connection electrode, and the fourth electrode portion of the second connection electrode faces the second electrode portion of the third type connection electrode.

In one or more embodiments, the first type connection electrodes further include a third connection electrode between the first connection electrode and the second connection electrode, wherein a third electrode portion and a fourth electrode portion of the first connection electrode are between a first electrode portion and a second electrode portion of the third connection electrode, and a third electrode portion and a fourth electrode portion of the third connection electrode are between a first electrode portion and a second electrode portion of the second connection electrode.

In one or more embodiments, the third electrode portion of the first connection electrode faces the first electrode portion of the third connection electrode, the fourth electrode portion of the first connection electrode faces the second electrode portion of the third connection electrode, the third electrode portion of the third connection electrode faces the first electrode portion of the second connection electrode, and the fourth electrode portion of the third connection electrode faces the second electrode portion of the second connection electrode.

In one or more embodiments, the first electrode portion and the second electrode portion of each first type connection electrode contact the second end of at least any one of the light emitting elements, and the third electrode portion and the fourth electrode portion of each first type connection electrode contact the first end of at least one of the plurality of light emitting elements.

In one or more embodiments, the plurality of light emitting elements includes a first light emitting element, a second light emitting element, a third light emitting element, and a fourth light emitting element spaced from each other in the second direction, wherein the first end of the first light emitting element contacts at least one of the first electrode portion and the second electrode portion of the second type connection electrode, the first end of the second light emitting element contacts at least one of the third electrode portion and the fourth electrode portion of the first connection electrode, the first end of the third light emitting element contacts at least one of the third electrode portion and the fourth electrode portion of the third connection electrode, and the first end of the fourth light emitting element contacts at least one of the third electrode portion and the fourth electrode portion of the second connection electrode.

According to one or more embodiments of the present disclosure, a display device includes, a first alignment electrode, a second alignment electrode, and a third alignment electrode extending in a first direction and spaced from each other and sequentially arranged along a second direction intersecting the first direction; a plurality of light emitting elements located at spaces between the first alignment electrode, the second alignment electrode and the third alignment electrode and each including a first end having a first polarity and a second end having a second polarity different from the first polarity; and a plurality of connection electrodes contacting the first ends and/or the second ends of the light emitting elements, wherein the plurality of light emitting elements include: a first light emitting element and a second light emitting element between the first alignment electrode and the second alignment electrode and spaced from each other in the first direction; and a third light emitting element and a fourth light emitting element between the second alignment electrode and the third alignment electrode and spaced from each other in the first direction, wherein the first end of the first light emitting element is electrically connected to the first end of the third light emitting element by one of the plurality of connection electrodes, and the second end of the first light emitting element is electrically connected to the first end of the second light emitting element and the first end of the fourth light emitting element by one of the plurality of connection electrodes.

In one or more embodiments, the second end of the third light emitting element is electrically connected to the first end of the second light emitting element and the first end of the fourth light emitting element by one of the plurality of connection electrodes.

In one or more embodiments, the plurality of light emitting elements is arranged along the first direction as a column in the space between the first alignment electrode and the second alignment electrode and is arranged along the first direction as a column in the space between the second alignment electrode and the third alignment electrode.

In one or more embodiments, a distance between the first alignment electrode and the second alignment electrode is 1 μm to 10 μm, and a distance between the second alignment electrode and the third alignment electrode is 1 μm to 10 μm.

In one or more embodiments, at least one of the plurality of connection electrodes includes: a middle portion extending in the second direction; a first electrode portion extending from the middle portion toward a first side in the first direction; a second electrode portion extending from the middle portion toward the first side in the first direction and spaced from the first electrode portion by a first width in the second direction; a third electrode portion extending from the middle portion toward a second side in the first direction; and a fourth electrode portion extending from the middle portion toward the second side in the first direction and spaced from the third electrode portion by a second width in the second direction, wherein the first width is greater than the second width, and a space between the first electrode portion and the second electrode portion overlaps a space between the third electrode portion and the fourth electrode portion in the first direction.

BRIEF DESCRIPTION OF THE DRAWINGS

These and/or other aspects and features of embodiments of the present disclosure will become apparent and more readily appreciated from the following description of the embodiments, taken in conjunction with the accompanying drawings in which.

5

6

Figure 4:
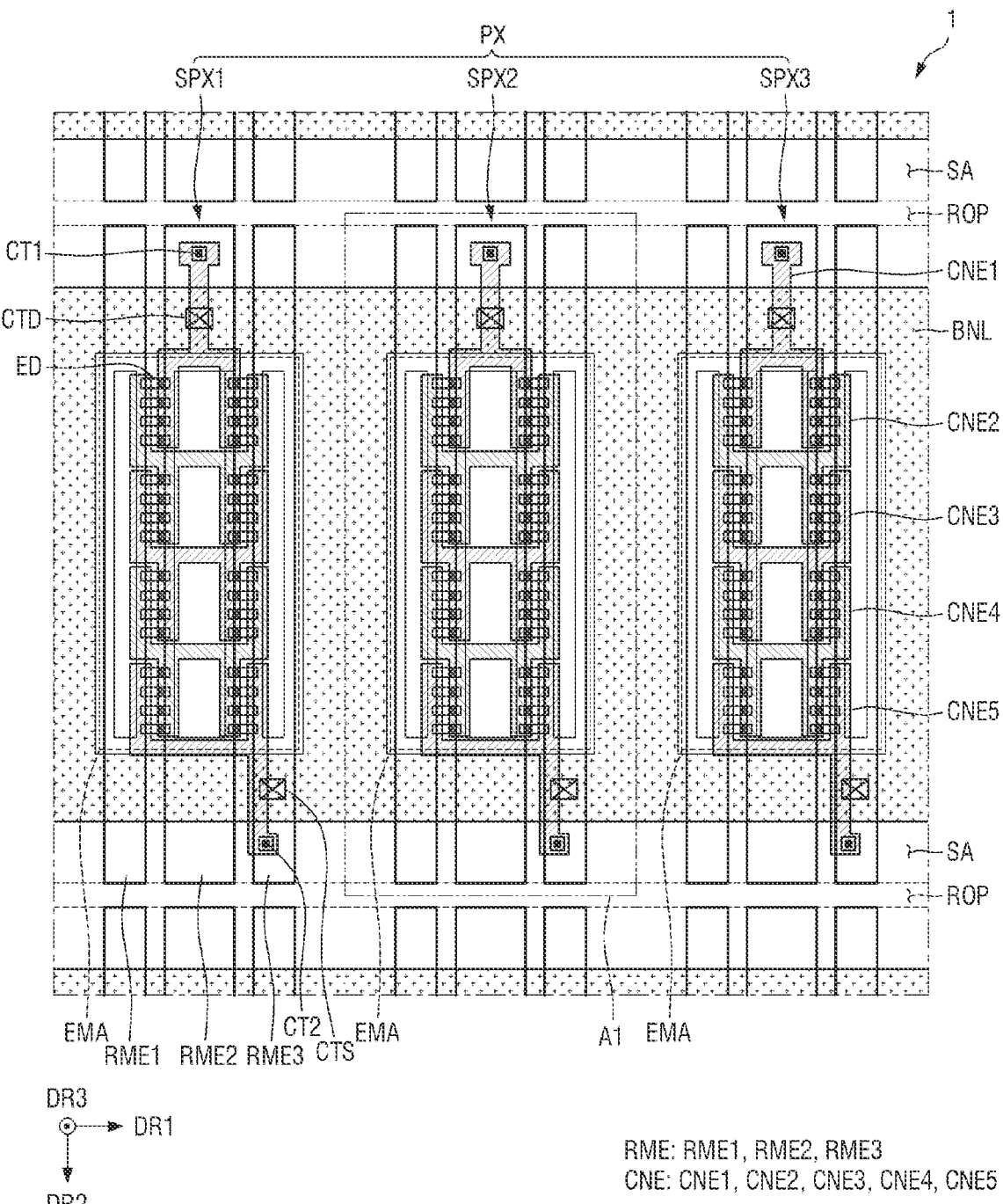
Figure 5:
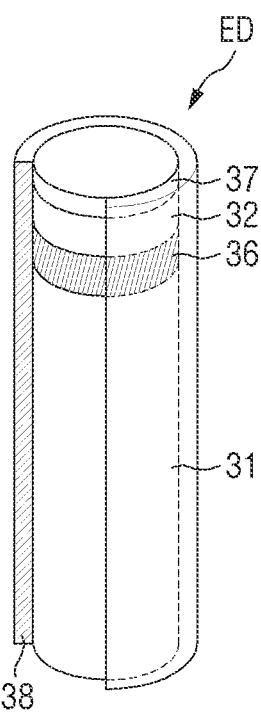
Figure 6:
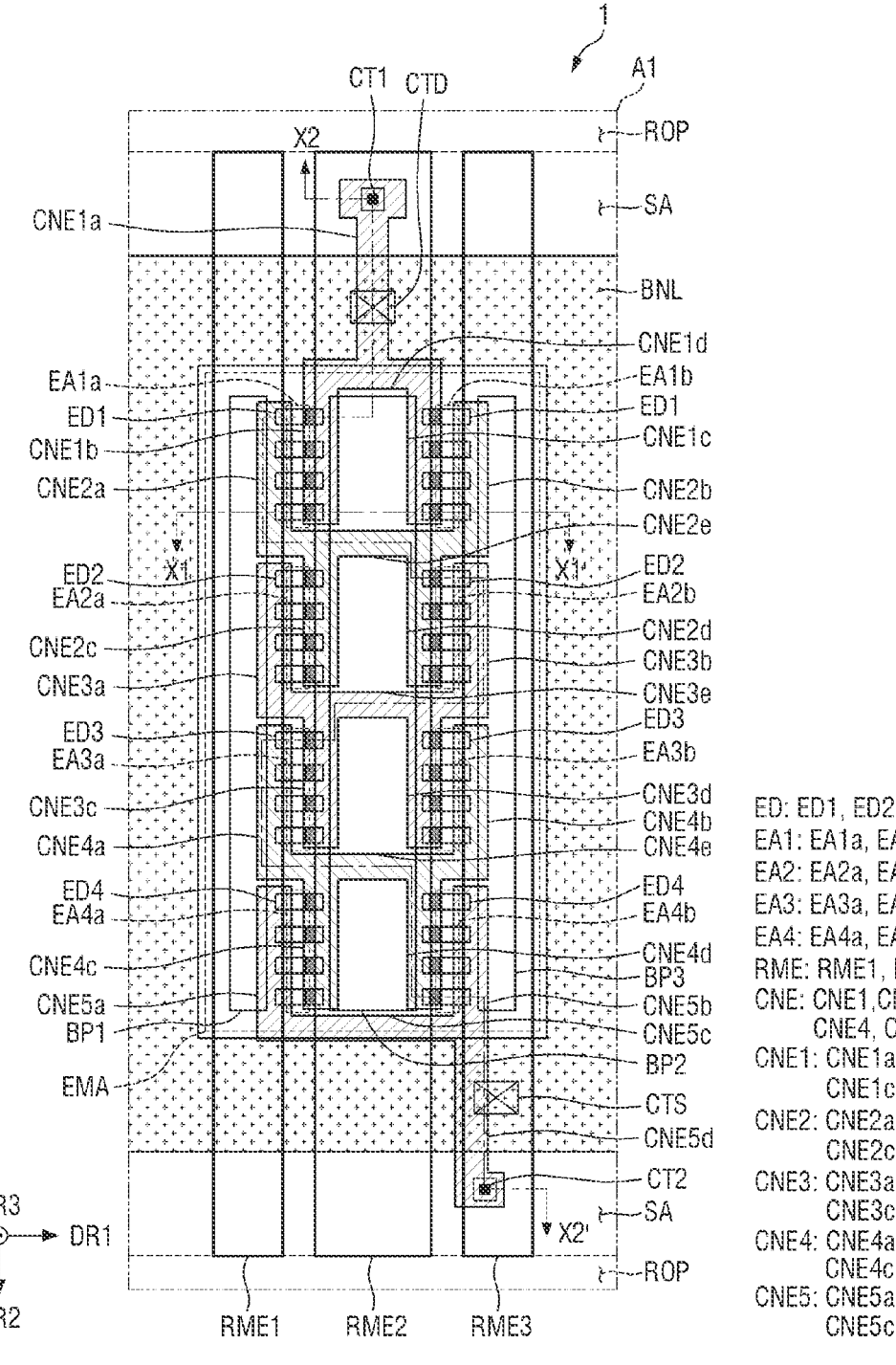
Figure 7:
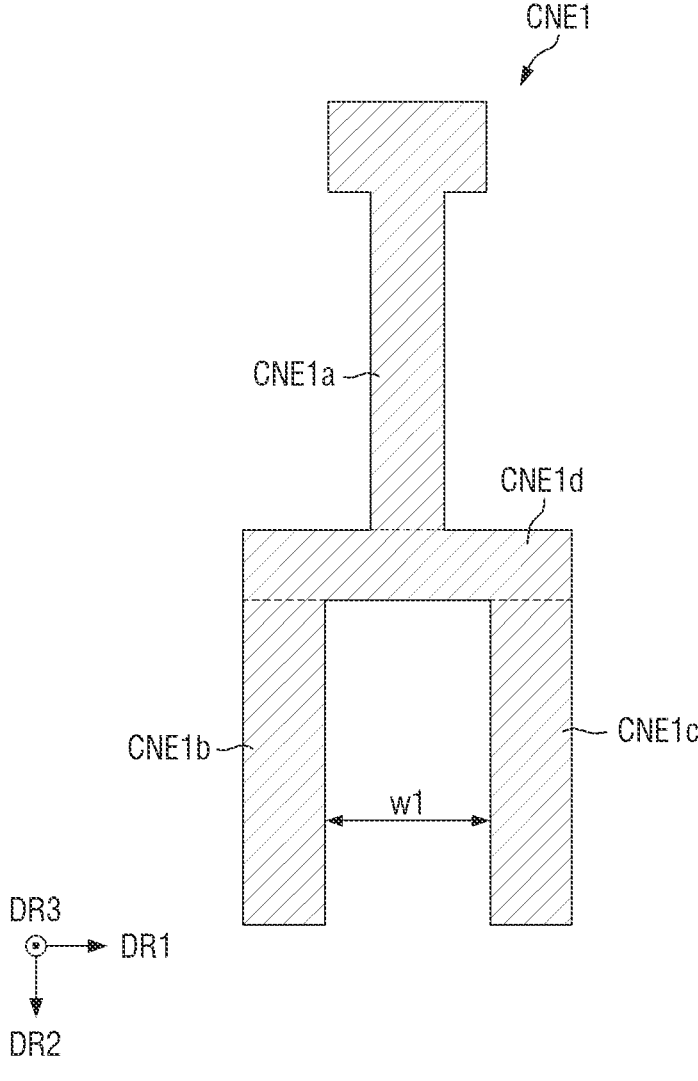
Figure 8:
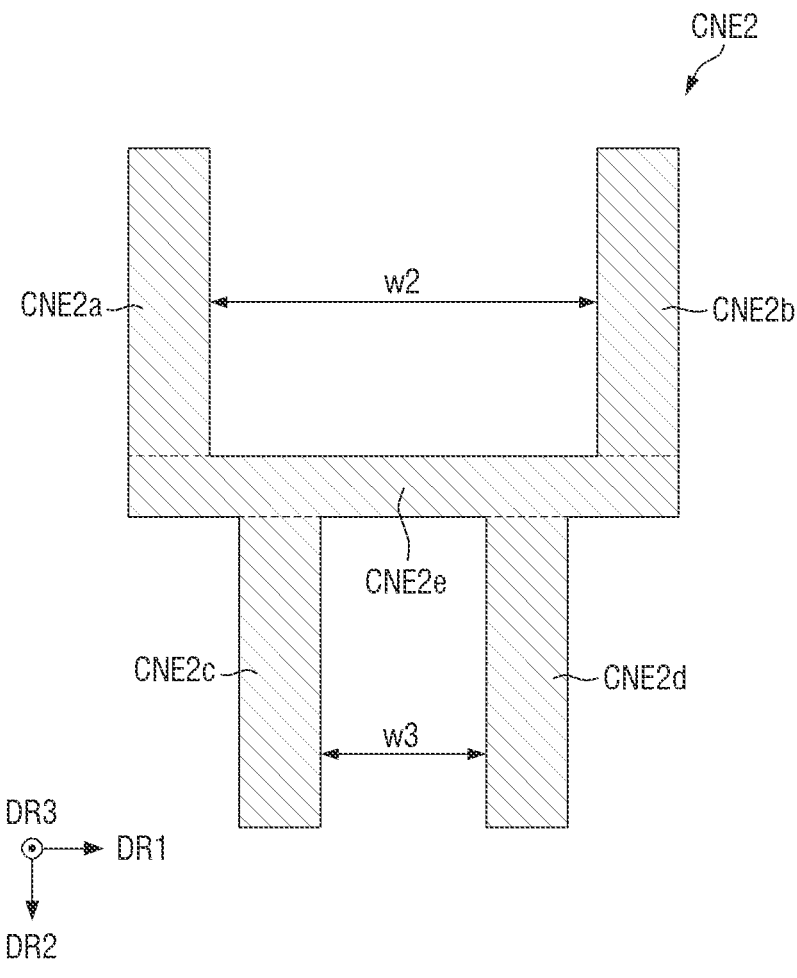
Figure 9:
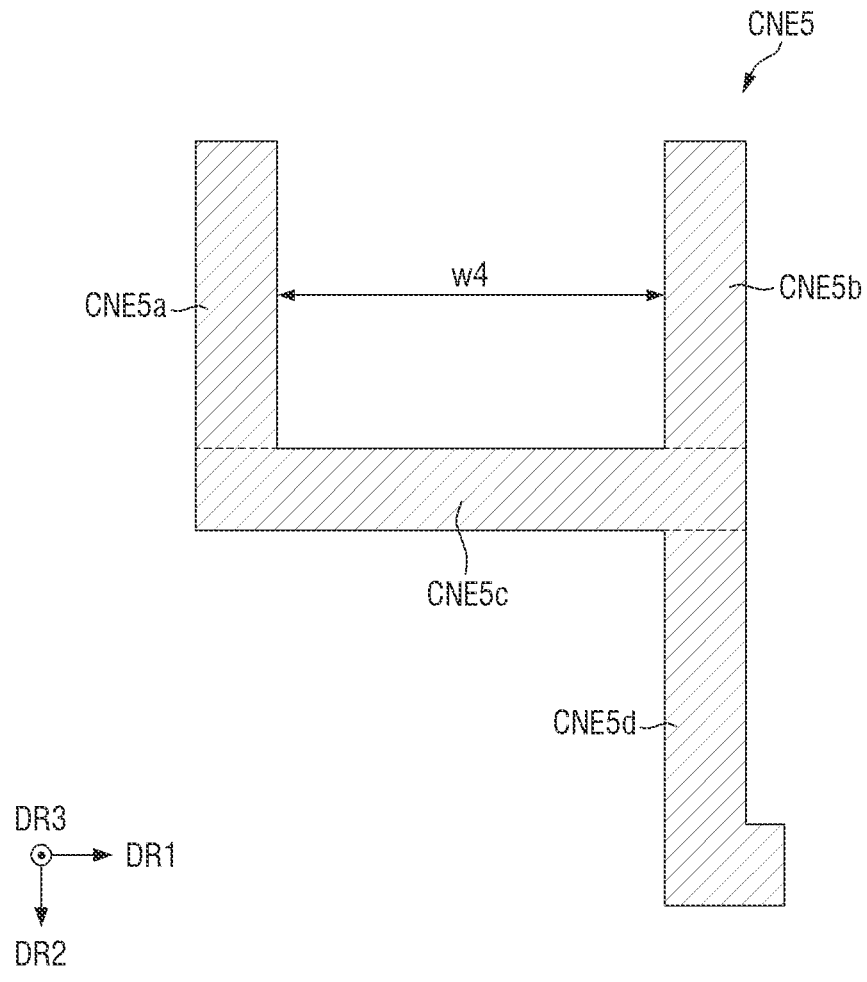
Figure 10:
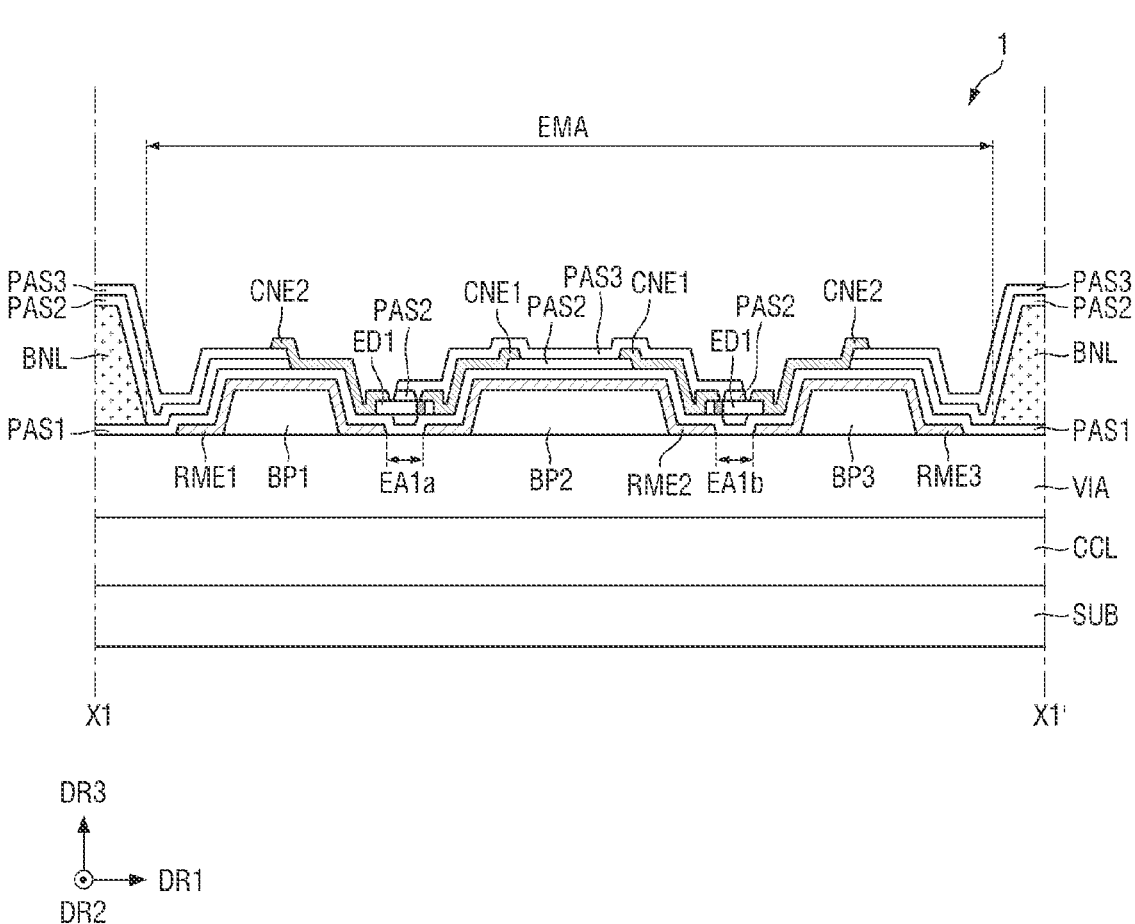
Figure 11:
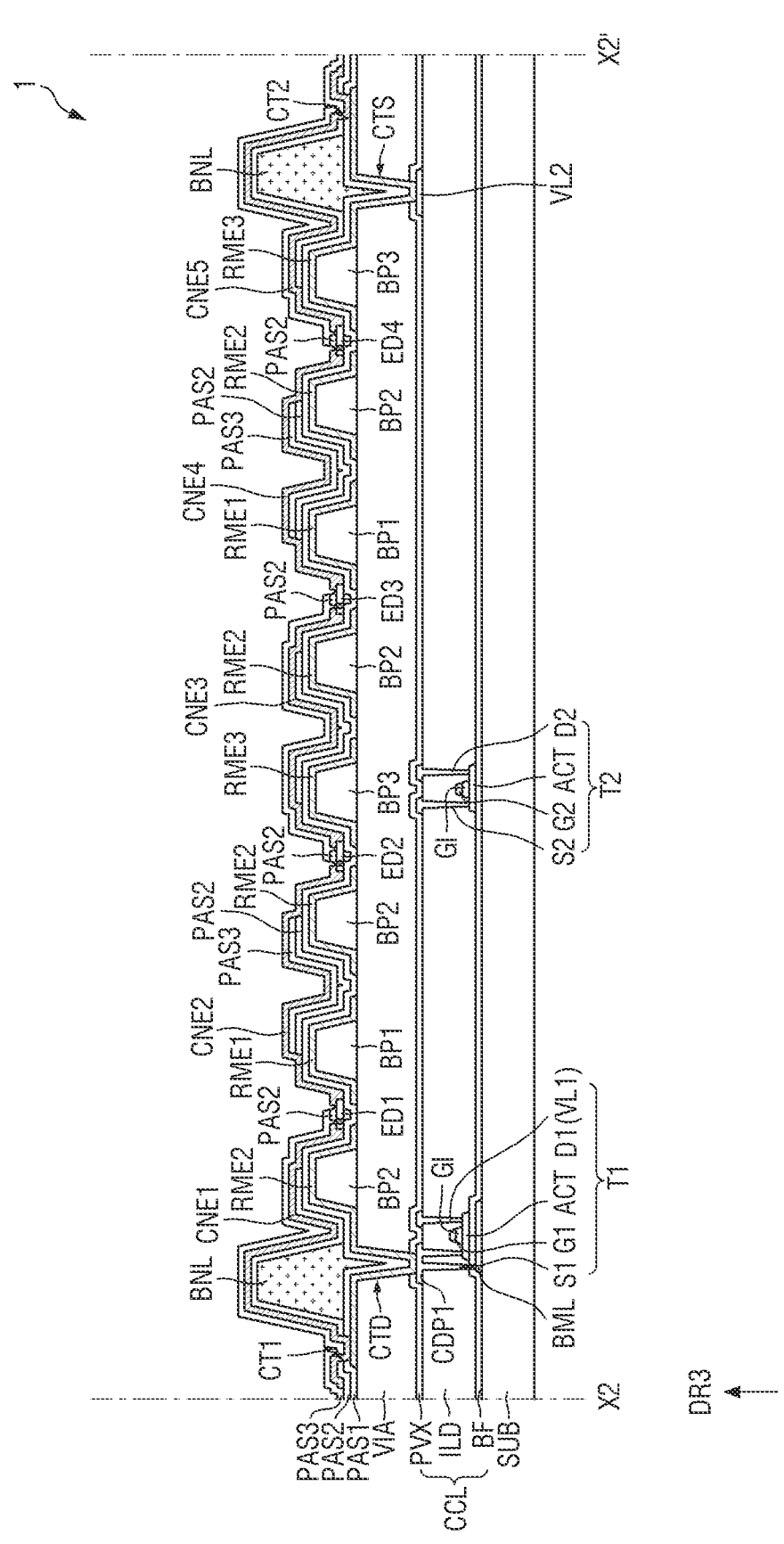
Figure 12:
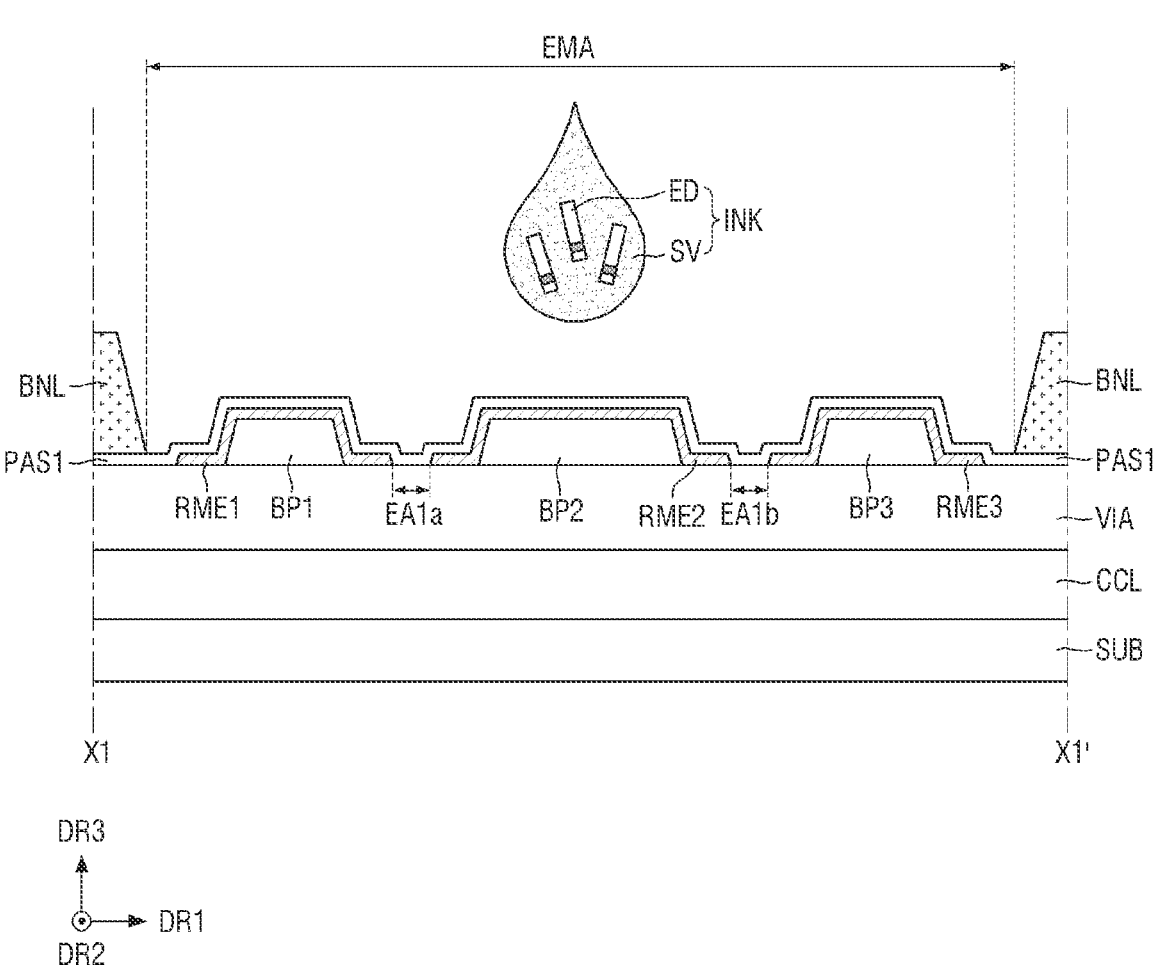
Figure 13:
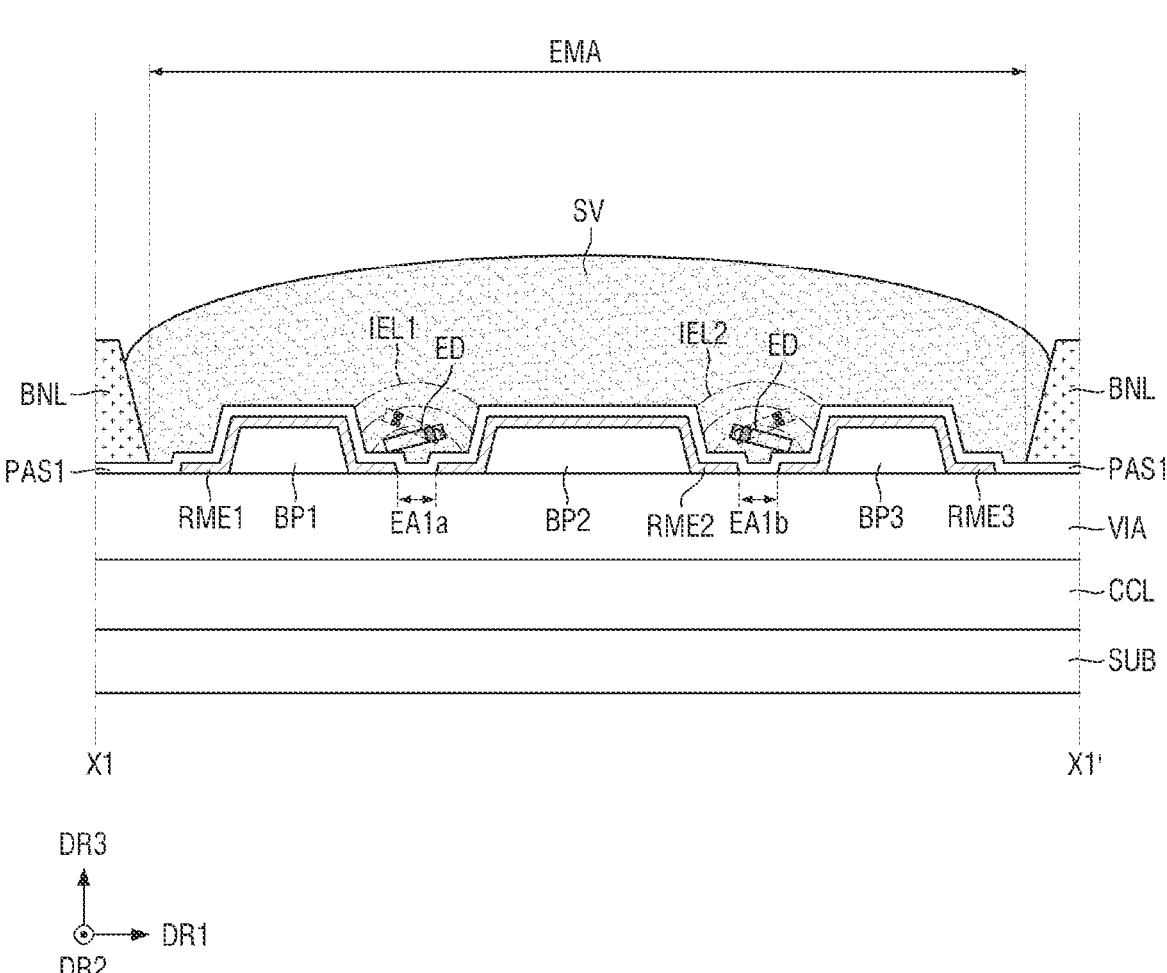
Figure 14:
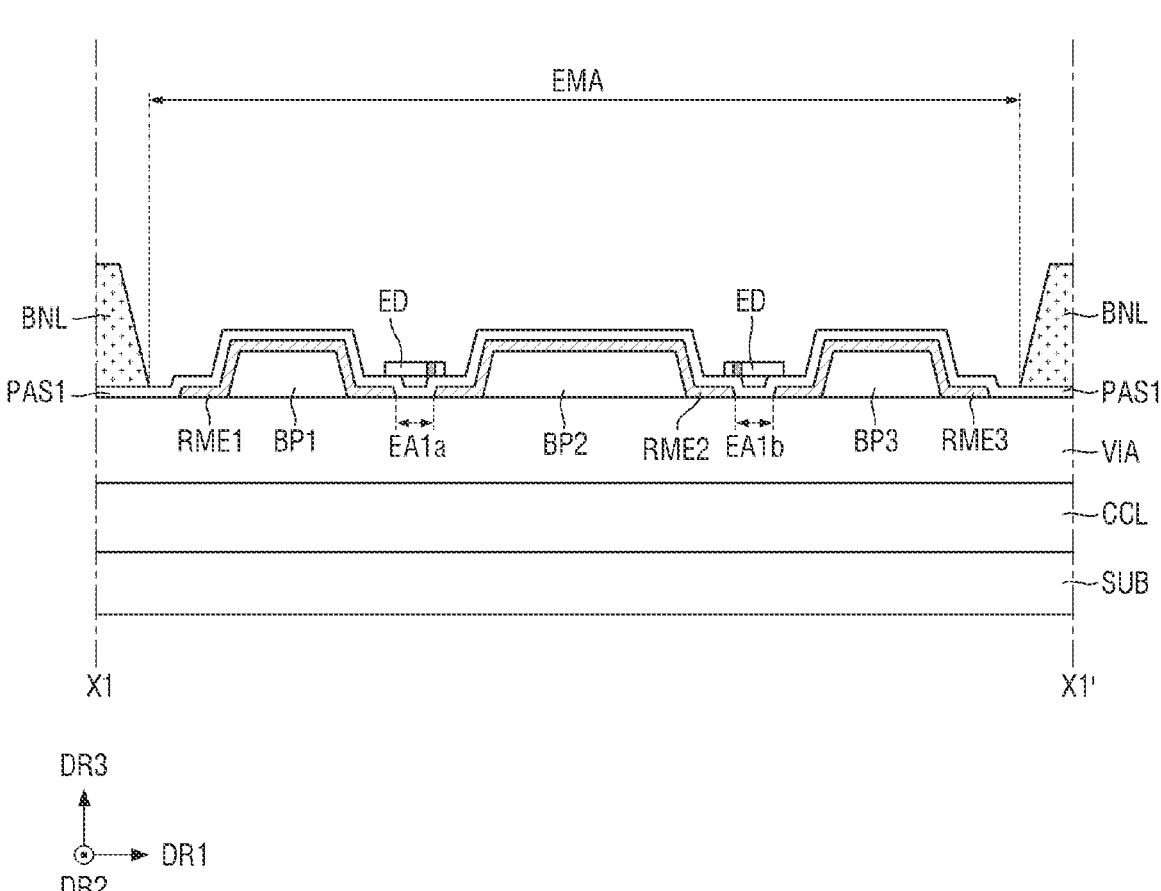
Figure 15:
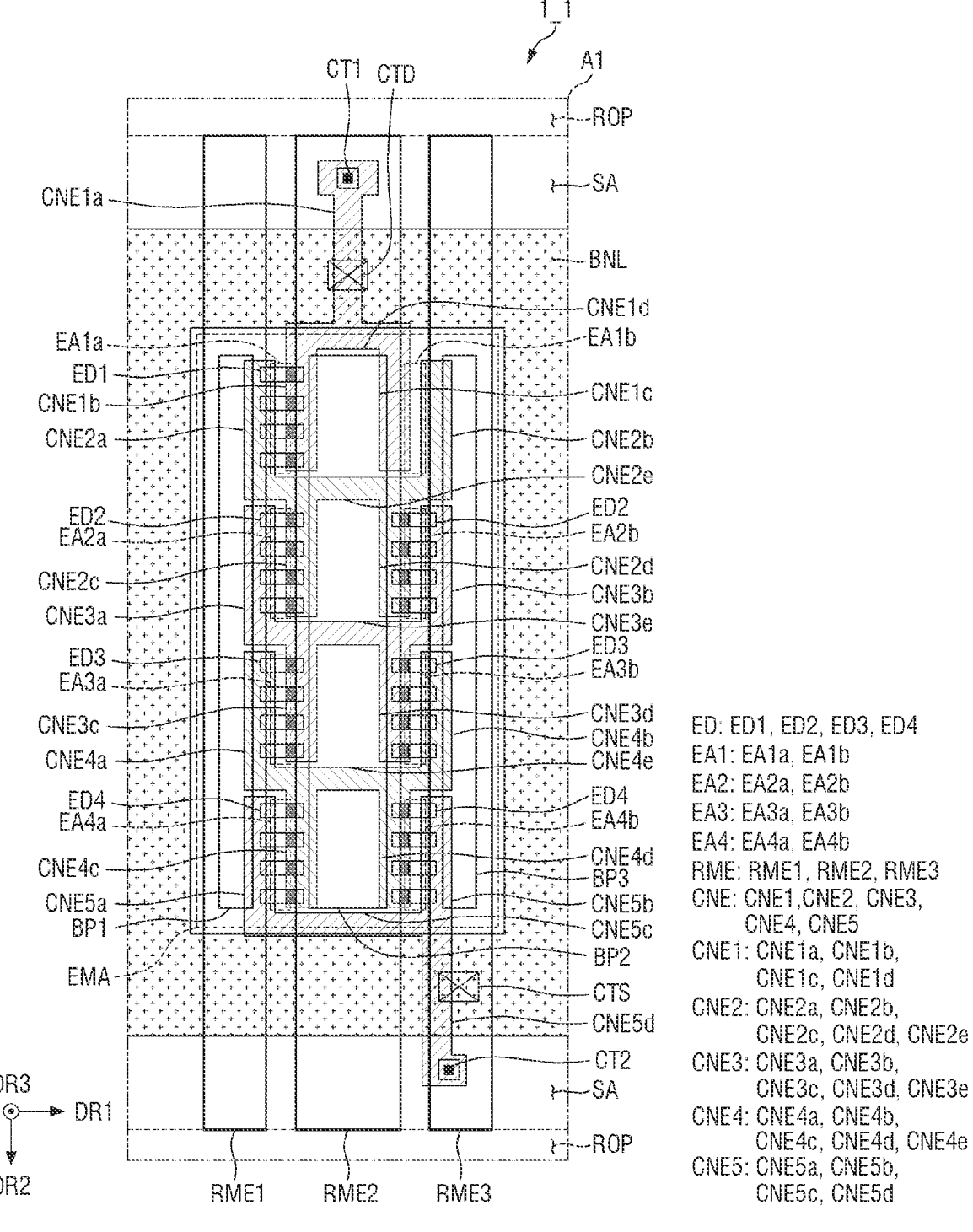
Figure 16:
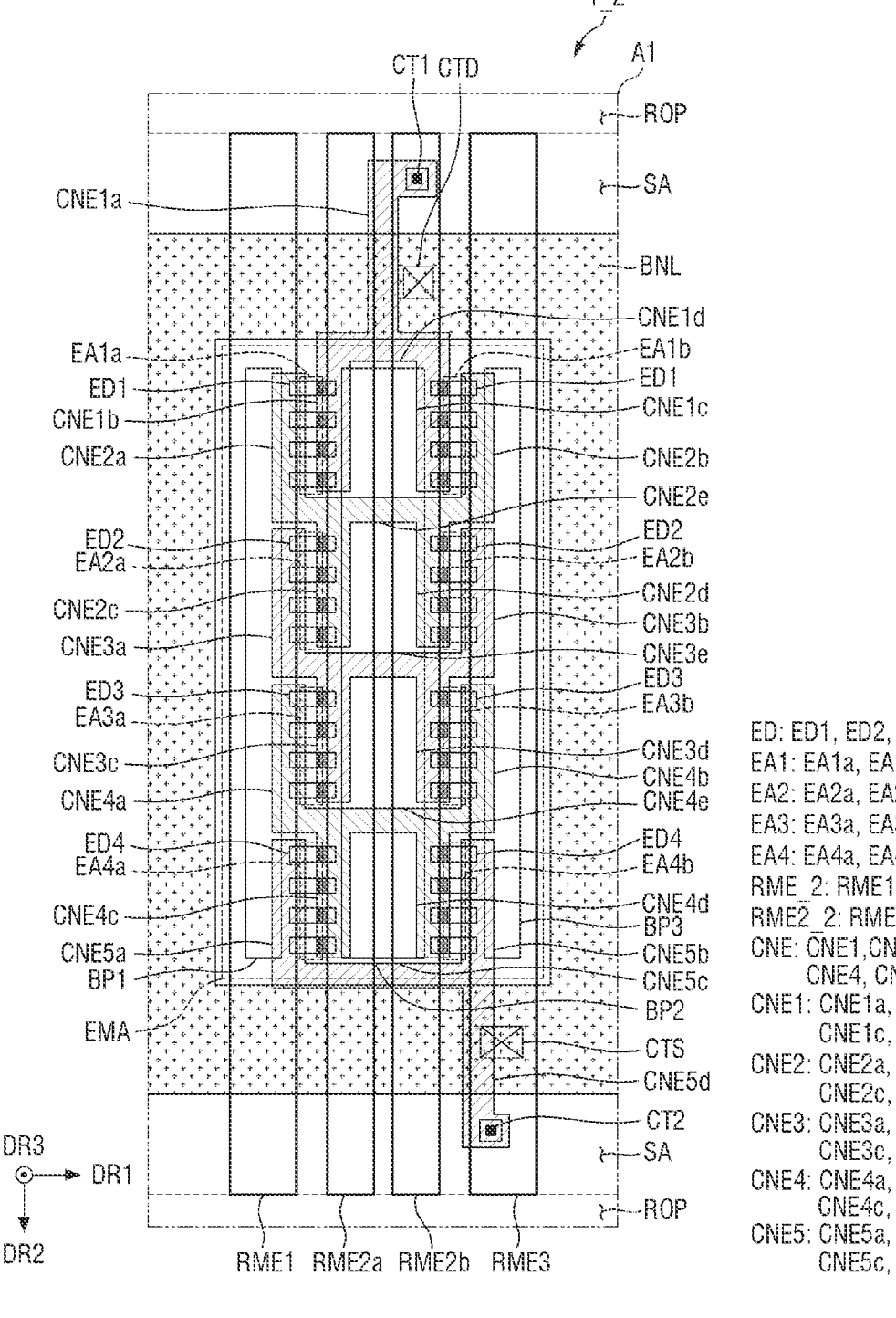
Figure 17:
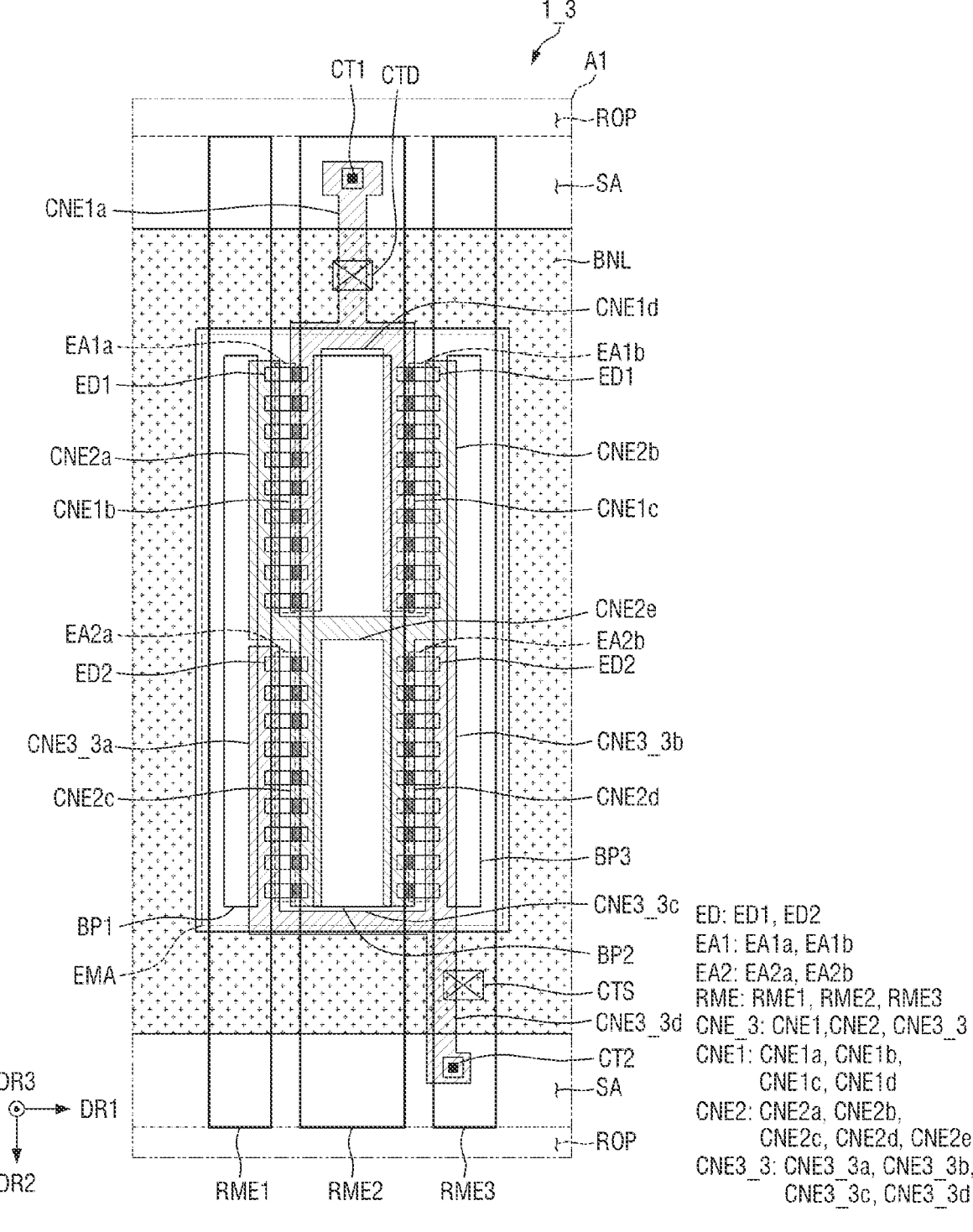
Figure 18:
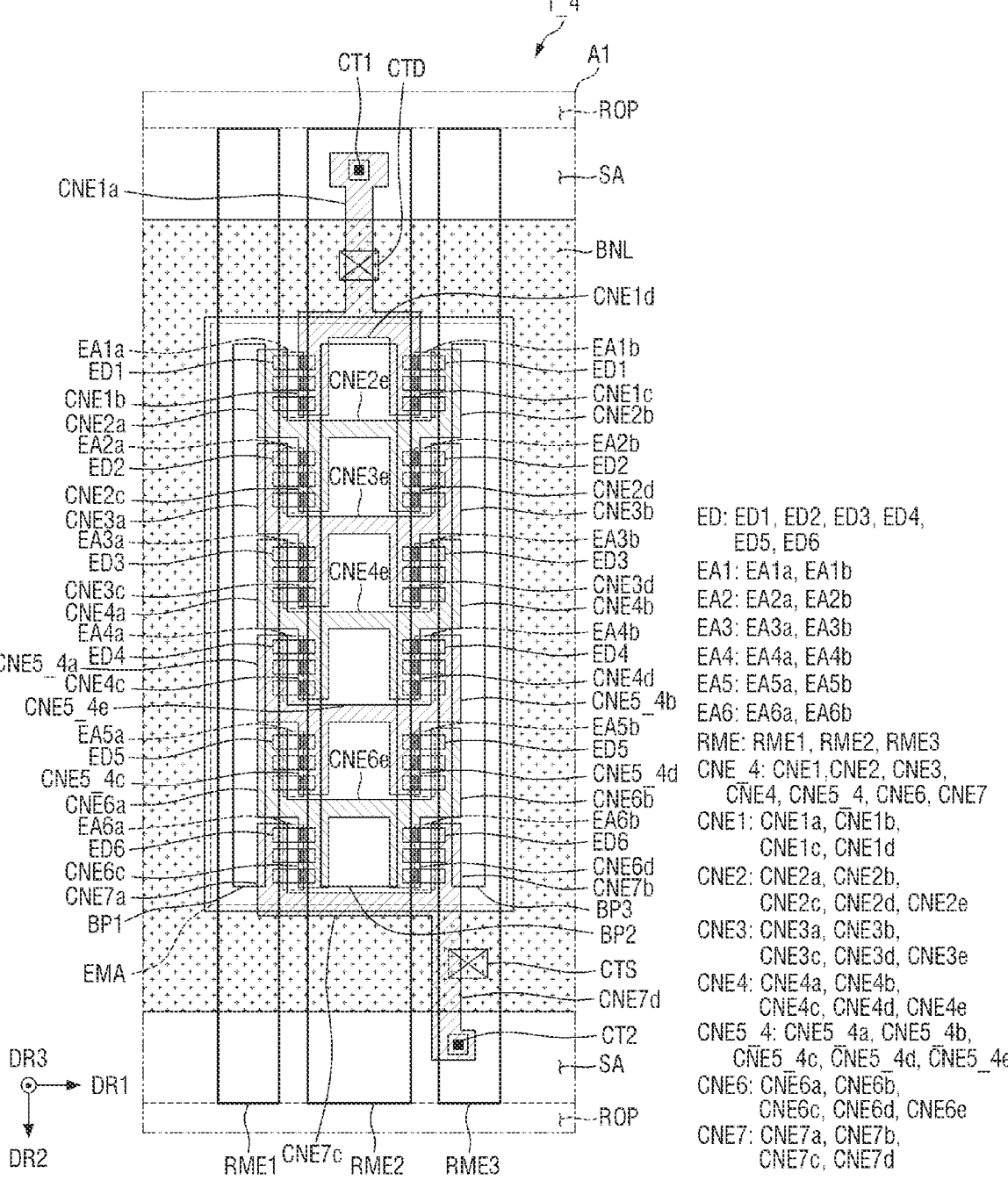

FIG. 4 is a plan view illustrating the structure of a pixel of the display device according to one or more embodiments;

FIG. 5 is a perspective cutaway view illustrating the structure of a light emitting element of FIG. 4;

FIG. 6 is an enlarged view of an area A1 of FIG. 4;

FIG. 7 is a plan view illustrating the structure of a first connection electrode according to one or more embodiments;

FIG. 8 is a plan view illustrating the structure of a second connection electrode according to one or more embodiments;

FIG. 9 is a plan view illustrating the structure of a fifth connection electrode according to one or more embodiments;

FIG. 10 is a schematic cross-sectional view taken along the line X1-X1' of FIG. 6;

FIG. 11 is a schematic cross-sectional view taken along the line X2-X2' of FIG. 6;

FIGS. 12 through 14 are cross-sectional views illustrating a process of manufacturing the display device according to one or more embodiments;

FIG. 15 is a plan view illustrating the structure of a subpixel of a display device according to one or more embodiments;

FIG. 16 is a plan view illustrating the structure of a subpixel of a display device according to one or more embodiments;

FIG. 17 is a plan view illustrating the structure of a subpixel of a display device according to one or more embodiments; and FIG. 18 is a plan view illustrating the structure of a subpixel of a display device according to one or more embodiments.

DETAILED DESCRIPTION

The present disclosure will now be described more fully hereinafter with reference to the accompanying drawings, in which embodiments of the present disclosure are shown. The present disclosure may, however, be embodied in different forms and should not be construed as limited to embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
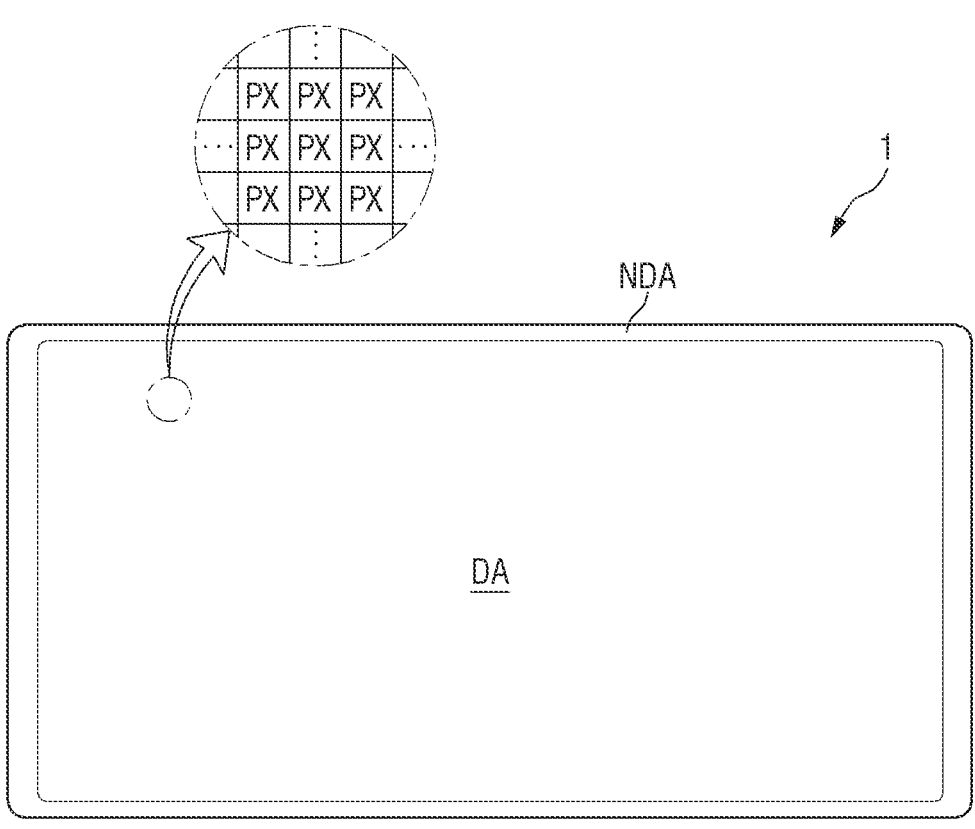
FIG. 1 is a schematic plan view of a display device according to one or more embodiments.
Figure 1:
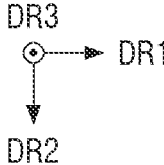

FIG. 1 is a schematic plan view of a display device 1 according to one or more embodiments.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an up-down direction in the drawing, that is, a thickness direction of the display device 1.

In the following specification, unless otherwise specified, a "direction" may refer to both directions extending to both sides along the direction. In addition, when it is necessary to distinguish both "directions" extending to both sides, a first side is referred to as a "first side in the direction," and a second side is referred to as a "second side in the direction." Based on FIG. 1, a direction in which an arrow is directed is referred to as the first side, and a direction opposite to the direction is referred to as the second side.

Hereinafter, for ease of description, in referring to surfaces of the display device 1 or each member constituting the display device 1, one surface facing the first side in a direction in which an image is displayed, that is, in the third direction DR3 is referred to as a top surface, and a surface opposite the one surface is referred to as a bottom surface. However, the present disclosure is not limited thereto, and the one surface and the other surface of each member may also be referred to as a front surface and a rear surface or as a first surface and a second surface, respectively. In addition, in describing relative positions of the members of the display device 1, the first side in the third direction DR3 may be referred to as an upper side, and the second side in the third direction DR3 may be referred to as a lower side.

Referring to FIG. 1, the display device 1 displays moving images or still images. The display device 1 may refer to any electronic device that provides a display screen. Examples of the display device 1 may include a television, a notebook computer, a monitor, a billboard, an Internet of things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera and a camcorder, all of which provide a display screen.

The display device 1 includes a display panel that provides a display screen. Examples of the display panel may include an inorganic light emitting diode display panel, an organic light emitting display panel, a quantum dot light emitting display panel, a plasma display panel, and a field emission display panel. A case where an inorganic light emitting diode display panel is applied as an example of the display panel will be described below, but the present disclosure is not limited to this case, and other display panels can also be applied as long as the same technical spirit is applicable.

The shape of the display device 1 can be variously modified. For example, the display device 1 may have various shapes such as a horizontally long rectangle, a vertically long rectangle, a square, a quadrilateral with rounded corners (or vertices), other polygons, or a circle. The shape of a display area DA of the display device 1 may also be similar to the overall shape of the display device 1.

In FIG. 1, the display device 1 shaped like a rectangle that is long in the first direction DR1 is illustrated.

The display device 1 may include the display area DA and a non-display area NDA around an edge or periphery of the display area DA. The display area DA may be an area where an image can be displayed, and the non-display area NDA may be an area where no image is displayed. The display area DA may also be referred to as an active area, and the non-display area NDA may also be referred to as an inactive area. The display area DA may generally occupy a center (or a central region) of the display device 1.

The display area DA may include a plurality of pixels PX. The pixels PX may be arranged in a matrix direction. For example, the pixels PX may be arranged along rows and columns of a matrix. Each of the pixels PX may be rectangular or square in a plan view. However, the present disclosure is not limited thereto, and each of the pixels PX may also have a rhombic planar shape having each side inclined with respect to a direction. The pixels PX may be arranged in a stripe or island type. In addition, each of the pixels PX may include one or more light emitting elements which emit light of a specific wavelength band to display a specific color.

The non-display area NDA may be located around the display area DA. The non-display area NDA may entirely or partially surround the display area DA. The display area DA may be rectangular, and the non-display area NDA may be disposed adjacent to four sides of the display area DA. The non-display area NDA may form a bezel of the display device 1. In each non-display area NDA, wirings or circuit drivers included in the display device 1 may be located, or external devices may be mounted.

Figure 2:
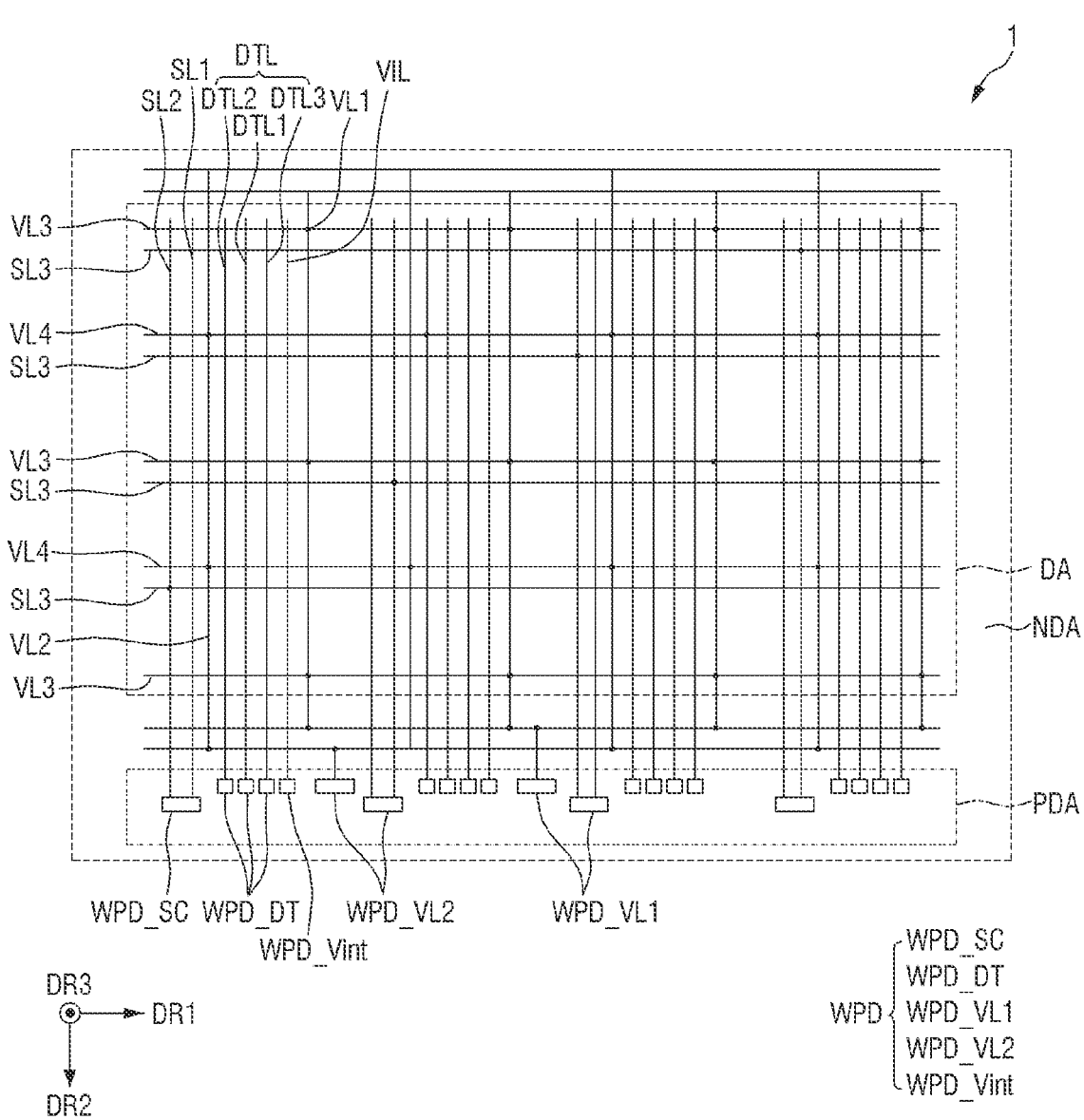
FIG. 2 is a schematic layout view illustrating a plurality of wirings of the display device according to one or more embodiments.

FIG. 2 is a schematic layout view illustrating a plurality of wirings of the display device 1 according to one or more embodiments.

Referring to FIG. 2, the display device 1 may include a plurality of wirings. The display device 1 may include a plurality of scan lines SL (SL1 through SL3), a plurality of data lines DTL (DTL1 through DTL3), initialization voltage wirings VIL, and a plurality of voltage wirings VL (VL1 through VL4). In addition, in one or more embodiments, other wirings may be further disposed in the display device 1. The wirings may include wirings made of a first conductive layer and extending in the first direction DR1 and wirings made of a third conductive layer and extending in the second direction DR2. However, the extending direction of each wiring is not limited thereto.

First scan lines SL1 and second scan lines SL2 may extend in the second direction DR2. A first scan line SL1 and a second scan line SL2 in each pair may be disposed adjacent to each other and may be spaced from other first scan lines SL1 and other second scan lines SL2 in the first direction DR1. The first and second scan lines SL1 and SL2 may be connected to each scan wiring pad WPD_SC connected to a scan driver. The first scan lines SL1 and the second scan lines SL2 may extend from a pad area PDA disposed in the non-display area NDA to the display area DA.

Each third scan line SL3 may extend in the first direction DR1 and may be spaced from other third scan lines SL3 in the second direction DR2. One third scan line SL3 may be connected to one or more first scan lines SL1 or one or more second scan lines SL2. The scan lines SL may have a mesh structure in the entire display area DA, but the present disclosure is not limited thereto.

In the present specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

The data lines DTL may extend in the second direction DR2. The data lines DTL may include first data lines DTL1, second data lines DTL2, and third data lines DTL3. Each one of the first through third data lines DTL1 through DTL3 may form one group and may be disposed adjacent to each other. The data lines DTL1 through DTL3 may extend from the pad area PDA disposed in the non-display area NDA to the display area DA. However, the present disclosure is not limited thereto, and the data lines DTL may also be disposed at equal intervals between first and second voltage wirings VL1 and VL2 to be described later.

The initialization voltage wirings VIL may extend in the second direction DR2. Each of the initialization voltage wirings VIL may be disposed between the data lines DTL and a first voltage wiring VL1. The initialization voltage wirings VIL may extend from the pad area PDA disposed in the non-display area NDA to the display area DA.

The first voltage wirings VL1 and the second voltage wirings VL2 extend in the second direction DR2, and third voltage wirings VL3 and fourth voltage wirings VL4 extend in the first direction DR1. The first voltage wirings VL1 and the second voltage wirings VL2 may be alternately arranged along the first direction DR1, and the third voltage wirings VL3 and the fourth voltage wirings VL4 may be alternately arranged along the second direction DR2. The first voltage wirings VL1 and the second voltage wirings VL2 may extend in the second direction DR2 to cross the display area DA. From among the third voltage wirings VL3 and the fourth voltage wirings VL4, some wirings may be disposed in the display area DA, and other wirings may be disposed in the non-display area NDA located on both sides of the display area DA in the first direction DR1 and the second direction DR2. The first voltage wirings VL1 and the second voltage wirings VL2 may be made of the first conductive layer, and the third voltage wirings VL3 and the fourth voltage wirings VL4 may be made of the third conductive layer disposed on a different layer from the first conductive layer. Each of the first voltage wirings VL1 may be connected to at least one third voltage wiring VL3, and each of the second voltage wirings VL2 may be connected to at least one fourth voltage wiring VL4. Therefore, the voltage wirings VL may have a mesh structure in the entire display area DA. However, the present disclosure is not limited thereto.

The first scan lines SL1, the second scan lines SL2, the data lines DTL, the initialization voltage wirings VIL, the first voltage wirings VL1, and the second voltage wirings VL2 may be electrically connected to at least one wiring pad WPD. Each wiring pad WPD may be disposed in the non-display area NDA. In one or more embodiments, each wiring pad WPD may be disposed in the pad area PDA located on a lower side of the display area DA, which is a first side in the second direction DR2. The first and second scan lines SL1 and SL2 are connected to each scan wiring pad WPD_SC disposed in the pad area PDA, and the data lines DTL are connected to different data wiring pads WPD_DT, respectively. Each of the initialization voltage wirings VIL is connected to an initialization wiring pad WPD_Vint, the first voltage wirings VL1 are connected to a first voltage wiring pad WPD_VL1, and the second voltage wirings VL2 are connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DA in the drawing, the present disclosure is not limited thereto. Some of the wiring pads WPD may also be disposed in an area located on an upper side or any one of left and right sides of the display area DA.

Each pixel PX or subpixel SPXn (where n is an integer of 1 to 3) of the display device 1 includes a pixel driving circuit. The above-described wirings may transmit driving signals to each pixel driving circuit while passing through or around each pixel PX. The pixel driving circuit may include a transistor and a capacitor. The number of transistors and capacitors in each pixel driving circuit can be variously changed. According to one or more embodiments, each subpixel SPXn of the display device 1 may have a 3T1C structure in which the pixel driving circuit includes three transistors and one capacitor. Although the pixel driving circuit will be described below using the 3T1C structure as an example, the present disclosure is not limited thereto, and other various modified structures such as a 2T1C structure, a 7T1C structure, and a 6T1C structure are also applicable.

Figure 3:
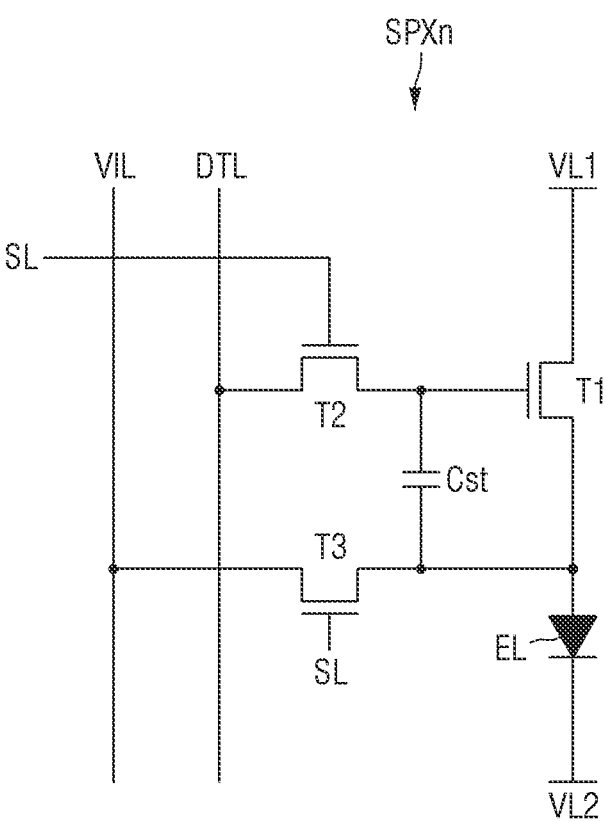
FIG. 3 is a pixel circuit diagram of the display device according to one or more embodiments.

FIG. 3 is a pixel circuit diagram of the display device 1 according to the embodiment.

Referring to FIG. 3, each subpixel SPXn of the display device 1 according to one or more embodiments and includes three transistors T1 through T3 and one storage capacitor Cst in addition to a light emitting diode EL.

The light emitting diode EL emits light according to a current supplied through a first transistor T1. The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be connected to a source electrode of the first transistor T1, and a second end of the light emitting diode EL may be connected to a second voltage wiring VL2 to which a low potential voltage (hereinafter, referred to as a second power supply voltage) lower than a high potential voltage (hereinafter, referred to as a first power supply voltage) of a first voltage wiring VL1 is supplied.

The first transistor T1 adjusts a current flowing from the first voltage wiring VL1, to which the first power supply voltage is supplied, to the light emitting diode EL according to a voltage difference between a gate electrode and the source electrode of the first transistor T1. For example, the first transistor T1 may be a driving transistor for driving the light emitting diode EL. The first transistor T1 may have the gate electrode connected to a source electrode of a second transistor T2, the source electrode connected to the first electrode of the light emitting diode EL, and a drain electrode connected to the first voltage wiring VL1 to which the first power supply voltage is applied.

The second transistor T2 is turned on by a scan signal of a scan line SL to connect a data line DTL to the gate electrode of the first transistor T1. The second transistor T2 may have a gate electrode connected to the scan line SL, the source electrode connected to the gate electrode of the first transistor T1, and a drain electrode connected to the data line DTL.

A third transistor T3 is turned on by a scan signal of a scan line SL to connect an initialization voltage wiring VIL to the first end of the light emitting diode EL. The third transistor T3 may have a gate electrode connected to the scan line SL, a drain electrode connected to the initialization voltage wiring VIL, and a source electrode connected to the first end of the light emitting diode EL or the source electrode of the first transistor T1.

In one or more embodiments, the source electrode and the drain electrode of each of the transistors T1 through T3 are not limited to the above description, and the opposite may also be the case. Each of the transistors T1 through T3 may be formed as a thin-film transistor (TFT). Although each of the transistors T1 through T3 is mainly described as an N-type metal oxide semiconductor field effect transistor (MOSFET) in FIG. 3, the present disclosure is not limited thereto. That is, each of the transistors T1 through T3 may also be formed as a P-type MOSFET, or some of the transistors T1 through T3 may be formed as N-type MOSFETs, and the other may be formed as a P-type MOSFET.

The storage capacitor Cst is formed between the gate electrode and the source electrode of the first transistor T1. The storage capacitor Cst stores a difference between a gate voltage and a source voltage of the first transistor T1.

In the embodiment of FIG. 3, the gate electrode of the second transistor T2 may be connected to the scan line SL, and the gate electrode of the third transistor T3 may be connected to the scan line SL. In other words, the second transistor T2 and the third transistor T3 may be turned on by a scan signal transmitted from the same scan line. However, the present disclosure is not limited thereto, and the second transistor T2 and the third transistor T3 may also be connected to different scan lines and turned on by scan signals transmitted from different scan lines.

The structure of a pixel PX of the display device 1 according to one or more embodiments will now be described.

FIG. 4 is a plan view illustrating the structure of a pixel PX of the display device 1 according to one or more embodiments. FIG. 5 is a perspective cutaway view illustrating the structure of a light emitting element ED of FIG. 4. FIG. 6 is an enlarged view of an area A1 of FIG. 4. FIG. 7 is a plan view illustrating the structure of a first connection electrode CNE1. FIG. 8 is a plan view illustrating the structure of a second connection electrode CNE2. FIG. 9 is a plan view illustrating the structure of a fifth connection electrode CNE5.

FIGS. 4 and 6 illustrate the planar arrangement of alignment electrodes RME, an outer bank BNL, a plurality of light emitting elements ED, and connection electrodes CNE in a pixel PX of the display device 1. FIGS. 7 through 9 illustrate various types of connection electrodes CNE.

Referring to FIGS. 4 and 6, each pixel PX of the display device 1 may include a plurality of subpixels SPXn. For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the present disclosure is not limited thereto, and the subpixels SPXn may also emit light of the same color. In one or more embodiments, the subpixels SPXn may emit blue light. Although one pixel PX includes three subpixels SPXn in the drawing, the present disclosure is not limited thereto, and the pixel PX may also include a greater number of subpixels SPXn. For ease of description, a case where one pixel PX includes three subpixels SPXn will be mainly described below.

The first subpixel SPX1, the second subpixel SPX2, and the third subpixel SPX3 may be sequentially arranged along a first side in the first direction DR1. For example, the first subpixel SPX1 may be disposed on a first side of the third subpixel SPX3 in the first direction DR1.

Accordingly, a pixel PX and at least any one of the subpixels SPXn of the pixel PX may neighbor at least any one of the subpixels SPXn of another pixel PX neighboring the pixel PX. For example, based on FIG. 4, the third subpixel SPX3 of a pixel PX disposed on a second side in the first direction DR1 may neighbor the first subpixel SPX1 of another pixel PX adjacent to a first side, in the first direction DR1, of the pixel PX disposed on the second side in the first direction DR1.

Each subpixel SPXn of the display device 1 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may be defined by the outer bank BNL. In other words, the emission area EMA may be a space surrounded by the outer bank BNL. The emission area EMA may have a rectangular shape including short sides in the first direction DR1 and long sides in the second direction DR2 in a plan view.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. A plurality of light emitting elements ED may be disposed in each subpixel SPXn, and an area where the light emitting elements ED are located and an area adjacent to this area may form the emission area EMA.

Although the respective emission areas EMA of the subpixels SPXn have the same area in the drawing, the present disclosure is not limited thereto. In one or more embodiments, the emission area EMA of each subpixel SPXn may have a different area according to the color or wavelength band of light emitted from the light emitting elements ED disposed in the subpixel SPXn. In one or more embodiments, a width of the emission area EMA in the first direction DR1 may be, but is not limited to, approximately 74 μm.

Each subpixel SPXn may further include a sub-area SA disposed in the non-emission area. The sub-area SA may be an area defined according to the arrangement of the alignment electrodes RME. The sub-area SA may be disposed on a first side and a second side of the emission area EMA of each subpixel SPXn in the second direction DR2. The emission area EMA may be repeatedly arranged along the first direction DR1, and the sub-area SA may extend in the first direction DR1. A plurality of emission areas EMA and a plurality of sub-areas SA may be alternately arranged along the second direction DR2. A plurality of emission areas EMA may be disposed between the sub-areas SA.

The sub-area SA may be an area shared by subpixels SPXn adjacent to each other in the first direction DR1. For example, the first subpixel SPX1, the second subpixel SPX2, and the third subpixel SPX3 may share the sub-area SA. In addition, the sub-area SA may be an area shared by subpixels SPXn adjacent to each other in the second direction DR2. For example, the sub-area SA disposed on both sides of the outer bank BNL in the second direction DR2 in FIG. 4 may be shared by the subpixels SPXn illustrated in the drawing and subpixels SPXn not illustrated in the drawing and adjacent to the subpixels SPXn in the second direction DR2.

Light may not exit from the sub-area SA because the light emitting elements ED are not disposed in the sub-area SA, but a portion of each of the alignment electrodes RME disposed in each subpixel SPXn may be disposed in the sub-area SA. The alignment electrodes RME disposed in different subpixels SPXn may be separated from each other by a separation portion ROP of the sub-area SA.

The alignment electrodes RME may include a first alignment electrode RME1, a second alignment electrode RME2, and a third alignment electrode RME3 sequentially arranged along the first side in the first direction DR1 in each subpixel SPXn. The first alignment electrode RME1, the second alignment electrode RME2, and the third alignment electrode RME3 may be spaced from each other in the first direction DR1.

Different alignment signals may be transmitted to the first alignment electrode RME1, the second alignment electrode RME2, and the third alignment electrode RME3 in a process of manufacturing the display device 1 according to one or more embodiments that will be described later. This will be described in detail later.

The first alignment electrode RME1 may be disposed on the second side of the emission area EMA in the first direction DR1. For example, the first alignment electrode RME1 may be spaced from a portion of the outer bank BNL which forms a side of the emission area EMA on the second side in the first direction DR1.

The first alignment electrode RME1 may extend in the second direction DR2. In one or more embodiments, the first alignment electrode RME1 may have a rectangular planar profile, but the present disclosure is not limited thereto. In FIGS. 4 and 6, the first alignment electrode RME1 has a rectangular planar profile.

The second alignment electrode RME2 may be disposed on a first side of the first alignment electrode RME1 in the first direction DR1. The second alignment electrode RME2 may be disposed between the first alignment electrode RME1 and the third alignment electrode RME3. In one or more embodiments, the second alignment electrode RME2 may be disposed in a center of the emission area EMA, but the present disclosure is not limited thereto.

The second alignment electrode RME2 may extend in the second direction DR2. In one or more embodiments, the second alignment electrode RME2 may have a rectangular planar profile, but the present disclosure is not limited thereto. In FIGS. 4 and 6, the second alignment electrode RME2 has a rectangular planar profile.

The second alignment electrode RME2 may be electrically connected to a circuit element layer CCL (see FIG. 11), which will be described later, through a first electrode contact hole CTD. The second alignment electrode RME2 may receive the above-described first power supply voltage through the first electrode contact hole CTD.

The third alignment electrode RME3 may be disposed on a first side of the emission area EMA in the first direction DR1. For example, the third alignment electrode RME3 may be spaced from a portion of the outer bank BNL that forms a side of the emission area EMA on the first side in the first direction DR1.

The third alignment electrode RME3 may extend in the second direction DR2. In one or more embodiments, the third alignment electrode RME3 may have a rectangular planar profile, but the present disclosure is not limited thereto. In FIGS. 4 and 6, the third alignment electrode RME3 has a rectangular planar profile.

The third alignment electrode RME3 may be electrically connected to the circuit element layer CCL (see FIG. 11), which will be described later, through a second electrode contact hole CTS. The third alignment electrode RME3 may receive the above-described second power supply voltage through the second electrode contact hole CTS.

The first electrode contact hole CTD and the second electrode contact hole CTS may not overlap the emission area EMA. In one or more embodiments, the first electrode contact hole CTD and the second electrode contact hole CTS may overlap the outer bank BNL, but the present disclosure is not limited thereto. For example, the first electrode contact hole CTD and the second electrode contact hole CTS may be disposed in the sub-area SA. In FIGS. 4 and 6, the first electrode contact hole CTD and the second electrode contact hole CTS overlap the outer bank BNL.

As illustrated in FIG. 6, a plurality of inner banks BP may be disposed under the alignment electrodes RME, respectively. The inner banks BP may be disposed in the emission area EMA of each subpixel SPXn. The inner banks BP may include a first inner bank BP1, a second inner bank BP2, and a third inner bank BP3, each having a rectangular planar shape extending in the second direction DR2. The first inner bank BP1, the second inner bank BP2, and the third inner bank BP3 may be spaced from each other in the first direction DR1.

The first inner bank BP1 may be disposed under the first alignment electrode RME1 in the emission area EMA, the second inner bank BP2 may be disposed under the second alignment electrode RME2 in the emission area EMA, and the third inner bank BP3 may be disposed under the third alignment electrode RME3 in the emission area EMA.

In one or more embodiments, the alignment electrodes RME may completely cover the inner banks BP respectively disposed under the alignment electrodes RME in the emission area EMA, but the present disclosure is not limited thereto. For example, the alignment electrodes RME may partially cover the inner banks BP respectively disposed under the alignment electrodes RME in the emission area EMA. In FIG. 6, the alignment electrodes RME completely cover the inner banks BP respectively disposed under the alignment electrodes RME in the emission area EMA.

The alignment electrodes RME may be spaced from each other in the first direction DR1 to provide a space in which the light emitting elements ED are disposed. For example, the light emitting elements ED may be disposed in a space between the first alignment electrode RME1 and the second alignment electrode RME2 and a space between the second alignment electrode RME2 and the third alignment electrode RME3.

Referring to FIG. 5, a light emitting element ED may be a light emitting diode. Specifically, the light emitting element ED may be an inorganic light emitting diode having a size of nanometers to micrometers and made of an inorganic material. When an electric field is formed in a specific direction between two electrodes facing each other, the light emitting element ED may be aligned between the two electrodes in which polarities are formed.

The light emitting element ED according to one or more embodiments may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped or a hexagonal prism, and a shape extending in a direction and having a partially inclined outer surface.

The light emitting element ED may include a semiconductor layer doped with a dopant of any conductivity type (e.g., a p-type or an n-type). The semiconductor layer may receive an electrical signal from an external power source and emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be one or more selected from among AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be one or more selected from among AlGaInN, GaN, AlGaN, InGaN, AlN, and InN doped with a p-type dopant. The p-type dopant used to dope the second semiconductor layer 32 may be Mg, Zn, Ca, Ba, or the like.

Accordingly, ends of the light emitting element ED may have different polarities from each other. For ease of description, one end adjacent to the second semiconductor layer 32 from among the ends of the light emitting element ED will hereinafter be referred to as a "first end," and the other end adjacent to the first semiconductor layer 31 will hereinafter be referred to as a "second end". The first end of the light emitting element ED may be located opposite the second end.

The first end and the second end of the light emitting element ED may have different polarities. For example, first ends of different light emitting elements ED may have the same polarity, and second ends of different light emitting elements ED may have the same polarity.

Although each of the first semiconductor layer 31 and the second semiconductor layer 32 is composed of one layer in the drawing, the present disclosure is not limited thereto. Each of the first semiconductor layer 31 and the second semiconductor layer 32 may also include more layers, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more selected from among AlGaInN, GaN, AlGaN, InGaN, AlN, InN, and SLs doped with an n-type dopant. The semiconductor layer disposed between the second semiconductor layer 32 and the light emitting layer 36 may be one or more selected from among AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to electrical signals received through the first semiconductor layer 31 and the second semiconductor layer 32. The light emitting layer 36 may include a material such as AlGaN, AlGaInN, or InGaN. In particular, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different Group III to V semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic connection electrode. However, the present disclosure is not limited thereto, and the electrode layer 37 may also be a Schottky connection electrode. The light emitting element ED may include at least one electrode layer 37. The light emitting element ED may include one or more electrode layers 37. However, the present disclosure is not limited thereto, and the electrode layer 37 may also be omitted.

When the light emitting element ED is electrically connected to electrodes or connection electrodes in the display device 1, the electrode layer 37 may reduce the resistance between the light emitting element ED and the electrodes or the connection electrodes. The electrode layer 37 may include a conductive metal. For example, the electrode layer 37 may include at least one selected from among aluminum (Al), titanium (Ti), indium (In), gold (Au), silver (Ag), indium tin oxide (ITO), indium zinc oxide (IZO), and indium tin zinc oxide (ITZO). Both ends of each light emitting element ED configured as described above may have different polarities.

The insulating film 38 may be around (e.g., may surround) outer surfaces (e.g., outer peripheral or circumferential surfaces) of the semiconductor layers and the electrode layer described above. For example, the insulating film 38 may be around (e.g., may surround) an outer surface (e.g., an outer peripheral or circumferential surface) of at least the light emitting layer 36 but may expose both ends of the light emitting element ED in a longitudinal direction. In addition, an upper surface of the insulating film 38 may be rounded in cross section in an area adjacent to at least one end of the light emitting element ED.

The insulating film 38 may include an insulating material, for example, at least one selected from among silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). Although the insulating film 38 is illustrated as a single layer in the drawing, the present disclosure is not limited thereto. In one or more embodiments, the insulating film 38 may be formed in a multilayer structure in which a plurality of layers are stacked.

The insulating film 38 may protect the semiconductor layers and the electrode layer of the light emitting element ED. The insulating film 38 may prevent an electrical short circuit that may occur in the light emitting layer 36 when the light emitting layer 36 directly contacts an electrode that transmits an electrical signal to the light emitting element ED. In addition, the insulating film 38 may prevent a reduction in luminous efficiency of the light emitting element ED.

In addition, an outer surface (e.g., an outer peripheral or circumferential surface) of the insulating film 38 may be treated. The light emitting element ED may be sprayed onto electrodes in a state where it is dispersed in ink (e.g., a predetermined ink) and then may be aligned. Here, the surface of the insulating film 38 may be hydrophobic or hydrophilic-treated so that the light emitting element ED is kept separate in the ink without being agglomerated with other adjacent light emitting elements ED.

Referring back to FIG. 6, the light emitting elements ED may include first light emitting elements ED1 disposed in a first lane EA1 of the emission area EMA of each subpixel SPXn, second light emitting elements ED2 disposed in a second lane EA2, third light emitting elements ED3 disposed in a third lane EA3, and fourth light emitting elements ED4 disposed in a fourth lane EA4.

Each of the first lane EA1, the second lane EA2, the third lane EA3, and the fourth lane EA4 may include a first portion disposed in the space between the first alignment electrode RME1 and the second alignment electrode RME2 and a second portion disposed in the space between the second alignment electrode RME2 and the third alignment electrode RME3. The first portion and the second portion may extend in the second direction DR2 and may be spaced from each other in the first direction DR1.

For example, the first lane EA1 may include a first portion EA1a disposed in the space between the first alignment electrode RME1 and the second alignment electrode RME2 and extending in the second direction DR2 and a second portion EA b disposed in the space between the second alignment electrode RME2 and the third alignment electrode RME3 and extending in the second direction DR2, respectively. The second lane EA2 may include a first portion EA2a disposed in the space between the first alignment electrode RME1 and the second alignment electrode RME2 and extending in the second direction DR2 and a second portion EA2b disposed in the space between the second alignment electrode RME2 and the third alignment electrode RME3 and extending in the second direction DR2, respectively. The third lane EA3 may include a first portion EA3a disposed in the space between the first alignment electrode RME1 and the second alignment electrode RME2 and extending in the second direction DR2 and a second portion EA3b disposed in the space between the second alignment electrode RME2 and the third alignment electrode RME3 and extending in the second direction DR2, respectively. The fourth lane EA4 may include a first portion EA4a disposed in the space between the first alignment electrode RME1 and the second alignment electrode RME2 and extending in the second direction DR2 and a second portion EA4b disposed in the space between the second alignment electrode RME2 and the third alignment electrode RME3 and extending in the second direction DR2, respectively.

The first lane EA1, the second lane EA2, the third lane EA3, and the fourth lane EA4 may be spaced from each other in the second direction DR2 and may be sequentially arranged along the first side in the second direction DR2. For example, the first portion EA a of the first lane EA1, the first portion EA2a of the second lane EA2, the first portion EA3a of the third lane EA3, and the first portion EA4a of the fourth lane EA4 may be spaced from each other in the second direction DR2. The second portion EA b of the first lane EA1, the second portion EA2b of the second lane EA2, the second portion EA3b of the third lane EA3, and the second portion EA4b of the fourth lane EA4 may be spaced from each other in the second direction DR2.

Each of the light emitting elements ED illustrated in FIG. 6, that is, each of the first light emitting elements ED1, the second light emitting elements ED2, the third light emitting elements ED3, and the fourth light emitting elements ED4 may include a hatched portion. The hatched portion in each of the light emitting elements ED may be the light emitting layer 36 illustrated in FIG. 5. Accordingly, an end adjacent to the hatched portion of each of the first light emitting elements ED1, the second light emitting elements ED2, the third light emitting elements ED3, and the fourth light emitting elements ED4 may be the first end described above, and the opposite end may be the second end.

The first light emitting elements ED1 may be disposed in at least any one of the first portion EA a and the second portion EA b of the first lane EA1. The first light emitting elements ED1 disposed in the first portion EA a of the first lane EA1 may extend in the first direction DR1 and may be oriented such that the first ends thereof are disposed on a second side of the second alignment electrode RME2 in the first direction DR1 and the second ends are disposed on a first side of the first alignment electrode RME1 in the first direction DR1. The first light emitting elements ED1 disposed in the second portion EA b of the first lane EA1 may extend in the first direction DR1 and may be oriented such that the first ends thereof are disposed on a first side of the second alignment electrode RME2 in the first direction DR1 and the second ends are disposed on a second side of the third alignment electrode RME3 in the first direction DR1. That is, the orientation of the first light emitting elements ED1 disposed in the first portion EA a of the first lane EA1 may be the reverse of the orientation of the first light emitting elements ED1 disposed in the second portion EA b of the first lane EA1.

It may be understood that the orientation of the light emitting elements ED described herein is distinguished according to the relative position of the first ends or the second ends of the light emitting elements ED. For example, in the display device 1 according to one or more embodiments, the first light emitting elements ED1 disposed in the first portion EA a of the first lane EA1 have the first ends facing the first side in the first direction DR1 and the second ends facing the second side in the first direction DR1. On the other hand, the first light emitting elements ED1 disposed in the second portion EA b of the first lane EA1 have the first ends facing the second side in the first direction DR1 and the second ends facing the first side in the first direction DR1. Therefore, it may be understood that the first light emitting elements ED1 disposed in the first portion EA a and the second portion EA b of the first lane EA1 have opposite orientations.

A plurality of first light emitting elements ED1 may be arranged side by side along the second direction DR2 to form a group in the first lane EA1. For example, the first light emitting elements ED1 may be arranged side by side along the second direction DR2 to form a first group as a column in the first portion EA1a of the first lane EA1 and may be arranged side by side along the second direction DR2 to form a second group as a column in the second portion EA b of the first lane EA1. The first ends of the first group of the first light emitting elements ED1 and the first ends of the second group of the first light emitting elements ED1 may be electrically connected by connection electrodes CNE. That is, the first group and the second group of the first light emitting elements ED1 may be connected in parallel.

The second light emitting elements ED2 may be disposed in at least any one of the first portion EA2a and the second portion EA2b of the second lane EA2. The second light emitting elements ED2 disposed in the first portion EA2a of the second lane EA2 may extend in the first direction DR1 and may be oriented such that the first ends thereof are disposed on the second side of the second alignment electrode RME2 in the first direction DR1 and the second ends are disposed on the first side of the first alignment electrode RME1 in the first direction DR1. The second light emitting elements ED2 disposed in the second portion EA2b of the second lane EA2 may extend in the first direction DR1 and may be oriented such that the first ends thereof are disposed on the first side of the second alignment electrode RME2 in the first direction DR1 and the second ends are disposed on the second side of the third alignment electrode RME3 in the first direction DR1. That is, the orientation of the second light emitting elements ED2 disposed in the first portion EA2a of the second lane EA2 may be the reverse of the orientation of the second light emitting elements ED2 disposed in the second portion EA2b of the second lane EA2.

A plurality of second light emitting elements ED2 may be arranged side by side along the second direction DR2 to form a group in the second lane EA2. For example, the second light emitting elements ED2 may be arranged side by side in the second direction DR2 to form a first group as a column in the first portion EA2a of the second lane EA2 and may be arranged side by side along the second direction DR2 to form a second group as a column in the second portion EA2b of the second lane EA2. The first ends of the first group of the second light emitting elements ED2 and the first ends of the second group of the second light emitting elements ED2 may be electrically connected by the connection electrodes CNE. That is, the first group and the second group of the second light emitting elements ED2 may be connected in parallel.

The third light emitting elements ED3 may be disposed in at least any one of the first portion EA3a and the second portion EA3b of the third lane EA3. The third light emitting elements ED3 disposed in the first portion EA3a of the third lane EA3 may extend in the first direction DR1 and may be oriented such that the first ends thereof are disposed on the second side of the second alignment electrode RME2 in the first direction DR1 and the second ends are disposed on the first side of the first alignment electrode RME1 in the first direction DR1. The third light emitting elements ED3 disposed in the second portion EA3b of the third lane EA3 may extend in the first direction DR1 and may be oriented such that the first ends thereof are disposed on the first side of the second alignment electrode RME2 in the first direction DR1 and the second ends are disposed on the second side of the third alignment electrode RME3 in the first direction DR1. That is, the orientation of the third light emitting elements ED3 disposed in the first portion EA3a of the third lane EA3 may be the reverse of the orientation of the third light emitting elements ED3 disposed in the second portion EA3b of the third lane EA3.

A plurality of third light emitting elements ED3 may be arranged side by side along the second direction DR2 to form a group in the third lane EA3. For example, the third light emitting elements ED3 may be arranged side by side along the second direction DR2 to form a first group as a column in the first portion EA3a of the third lane EA3 and may be arranged side by side along the second direction DR2 to form a second group as a column in the second portion EA3b of the third lane EA3. The first ends of the first group of the third light emitting elements ED3 and the first ends of the second group of the third light emitting elements ED3 may be electrically connected by the connection electrodes CNE. That is, the first group and the second group of the third light emitting elements ED3 may be connected in parallel.

The fourth light emitting elements ED4 may be disposed in at least any one of the first portion EA4a and the second portion EA4b of the fourth lane EA4. The fourth light emitting elements ED4 disposed in the first portion EA4a of the fourth lane EA4 may extend in the first direction DR1 and may be oriented such that the first ends thereof are disposed on the second side of the second alignment electrode RME2 in the first direction DR1 and the second ends are disposed on the first side of the first alignment electrode RME1 in the first direction DR1. The fourth light emitting elements ED4 disposed in the second portion EA4b of the fourth lane EA4 may extend in the first direction DR1 and may be oriented such that the first ends thereof are disposed on the first side of the second alignment electrode RME2 in the first direction DR1 and the second ends are disposed on the second side of the third alignment electrode RME3 in the first direction DR1. That is, the orientation of the fourth light emitting elements ED4 disposed in the first portion EA4a of the fourth lane EA4 may be the reverse of the orientation of the fourth light emitting elements ED4 disposed in the second portion EA4b of the fourth lane EA4.

A plurality of fourth light emitting elements ED4 may be arranged side by side along the second direction DR2 to form a group in the fourth lane EA4. For example, the fourth light emitting elements ED4 may be arranged side by side along the second direction DR2 to form a first group as a column in the first portion EA4a of the fourth lane EA4 and may be arranged side by side along the second direction DR2 to form a second group as a column in the second portion EA4b of the fourth lane EA4. The first ends of the first group of the fourth light emitting elements ED4 and the first ends of the second group of the fourth light emitting elements ED4 may be electrically connected by the connection electrodes CNE. That is, the first group and the second group of the fourth light emitting elements ED4 may be connected in parallel.

The first lane EA1, the second lane EA2, the third lane EA3, and the fourth lane EA4 may be defined according to the arrangement of the connection electrodes CNE.

The connection electrodes CNE may be disposed on the light emitting elements ED. The connection electrodes CNE may include a first connection electrode CNE1, a second connection electrode CNE2, a third connection electrode CNE3, a fourth connection electrode CNE4, and a fifth connection electrode CNE5 spaced from each other in the second direction DR2.

Referring to FIGS. 7 through 9, the connection electrodes CNE may have various types of shapes. For example, the first connection electrode CNE1 may have a first type shape as illustrated in FIG. 7, the second connection electrode CNE2, the third connection electrode CNE3, and the fourth connection electrode CNE4 may have a second type shape as illustrated in FIG. 8, and the fifth connection electrode CNE5 may have a third type shape as illustrated in FIG. 9.

Although the second connection electrode CNE2 is illustrated as having the second type shape in FIG. 8, the third connection electrode CNE3 and the fourth connection electrode CNE4 may also have the second type shape, that is, may have substantially the same shape as the second connection electrode CNE2.

Referring to FIGS. 6 and 7, the first connection electrode CNE1 may have the first type shape branching to both sides in the first direction DR1 on the first side in the second direction DR2. The first connection electrode CNE1 may contact the first ends of the first light emitting elements ED1 disposed in the first lane EA1. The first connection electrode CNE1 may include a first power contact portion CNE1a, a first electrode portion CNE1b, a second electrode portion CNE1c, and a branch portion CNE1d. The first connection electrode CNE1 may be referred to as a second type connection electrode in the claims.

The first power contact portion CNE1a of the first connection electrode CNE1 may generally extend in the second direction DR2. The first power contact portion CNE1a may extend across the outer bank BNL to the sub-area SA.

The first power contact portion CNE1a may be electrically connected to the second alignment electrode RME2 through a first contact portion CT1. Because the first power supply voltage is applied to the second alignment electrode RME2 as described above, the first power supply voltage may also be applied to the first connection electrode CNE1. Accordingly, the first power supply voltage may be applied to the first ends of the first light emitting elements ED1 arranged in the first lane EA1.

In one or more embodiments, the first contact portion CT1 may be disposed in the sub-area SA, but the present disclosure is not limited thereto.

The branch portion CNE1d of the first connection electrode CNE1 may be disposed on a first side of the first power contact portion CNE1a in the second direction DR2 and may generally extend in the first direction DR1. Because the first power contact portion CNE1a is disposed in the middle of the branch portion CNE1d in the first direction DR1, the branch portion CNE1d may branch from the first power contact portion CNE1a to both sides in the first direction DR1.

The first electrode portion CNE1b of the first connection electrode CNE1 may extend from a second side of the branch portion CNE1d in the first direction DR1 toward the first side in the second direction DR2. The first electrode portion CNE1b may be disposed on the second side of the second alignment electrode RME2 in the first direction DR1 to contact the first ends of the first light emitting element ED1 arranged in the first portion EA1a of the first lane EA1.

The second electrode portion CNE1c of the first connection electrode CNE1 may extend from a first side of the branch portion CNE1d in the first direction DR1 toward the first side in the second direction DR2. The second electrode portion CNE1c may be disposed on the first side of the second alignment electrode RME2 in the first direction DR1 to contact the first ends of the first light emitting elements ED1 arranged in the second portion EA b of the first lane EA1.

The first electrode portion CNE1b and the second electrode portion CNE1c may be spaced from each other in the first direction DR1. For example, the first electrode portion CNE1b and the second electrode portion CNE1c may be spaced from each other by a first width w1 in the first direction DR1. In one or more embodiments, the first width w1 may be smaller than a width of the second alignment electrode RME2 in the first direction DR1.

Referring to FIGS. 6 and 8, the second connection electrode CNE2, the third connection electrode CNE3, and the fourth connection electrode CNE4 may have the second type shape branching to both sides in the first direction DR1 on the first side in the second direction DR2 and the second side in the second direction DR2. The second connection electrode CNE2, the third connection electrode CNE3, and the fourth connection electrode CNE4 may be referred to as first type connection electrodes in the claims.

The second connection electrode CNE2 may contact the second ends of the first light emitting elements ED1 disposed in the first lane EA1 and the first ends of the second light emitting elements ED2 disposed in the second lane EA2. The second connection electrode CNE2 may include a first electrode portion CNE2$a$, a second electrode portion CNE2$b$, a third electrode portion CNE2$c$, a fourth electrode portion CNE2$d$, and a middle portion CNE2$e$.

The middle portion CNE2$e$ of the second connection electrode CNE2 may extend in the first direction DR1 within the emission area EMA. At least a portion of the middle portion CNE2$e$ may face the first electrode portion CNE1$b$ and the second electrode portion CNE1$c$ of the first connection electrode CNE1 in the second direction DR2. A width of the middle portion CNE2$e$ in the first direction DR1 may be greater than the first width w1 between the first electrode portion CNE1$b$ and the second electrode portion CNE1$c$ of the first connection electrode CNE1.

The first electrode portion CNE2$a$ of the second connection electrode CNE2 may extend in the second direction DR2 from a second side of the middle portion CNE2$e$ in the first direction DR1 toward the second side in the second direction DR2. The first electrode portion CNE2$a$ may contact the second ends of the first light emitting elements ED1 arranged in the first portion EA a of the first lane EA1.

The second electrode portion CNE2$b$ of the second connection electrode CNE2 may extend in the second direction DR2 from a first side of the middle portion CNE2$e$ in the first direction DR1 toward the second side in the second direction DR2. The second electrode portion CNE2$b$ may contact the second ends of the first light emitting elements ED1 arranged in the second portion EA b of the first lane EA1.

The first electrode portion CNE2$a$ and the second electrode portion CNE2$b$ of the second connection electrode CNE2 may be spaced from each other by a second width w2 in the first direction DR1. The second width w2 may be greater than the first width w1 between the first electrode portion CNE1$b$ and the second electrode portion CNE1$c$ of the first connection electrode CNE1. Accordingly, the first electrode portion CNE1$b$ and the second electrode portion CNE1$c$ of the first connection electrode CNE1 may be disposed in a space between the first electrode portion CNE2$a$ and the second electrode portion CNE2$b$ of the second connection electrode CNE2. For example, the first electrode portion CNE2$a$ of the second connection electrode CNE2 may face the first electrode portion CNE1$b$ of the first connection electrode CNE1 in the first direction DR1, and the second electrode portion CNE2$b$ of the second connection electrode CNE2 may face the second electrode portion CNE1$c$ of the first connection electrode CNE1 in the first direction DR1.

The third electrode portion CNE2$c$ of the second connection electrode CNE2 may extend in the second direction DR2 from the second side of the middle portion CNE2$e$ in the first direction DR1 toward the first side in the second direction DR2. The third electrode portion CNE2$c$ may contact the first ends of the second light emitting elements ED2 arranged in the first portion EA2$a$ of the second lane EA2.

The fourth electrode portion CNE2$d$ of the second connection electrode CNE2 may extend in the second direction DR2 from the first side of the middle portion CNE2$e$ in the first direction DR1 toward the first side in the second direction DR2. The fourth electrode portion CNE2$d$ may contact the first ends of the second light emitting element ED2 arranged in the second portion EA2$b$ of the second lane EA2.

The third electrode portion CNE2$c$ and the fourth electrode portion CNE2$d$ of the second connection electrode CNE2 may be spaced from each other by a third width w3 in the first direction DR1. The third width w3 may be smaller than the second width w2. In one or more embodiments, the third width w3 may be substantially equal to the first width w1, but the present disclosure is not limited thereto.

A space between the third electrode portion CNE2$c$ and the fourth electrode portion CNE2$d$ may overlap the space between the first electrode portion CNE2$a$ and the second electrode portion CNE2$b$ in the second direction DR2. For example, the third electrode portion CNE2$c$ and the fourth electrode portion CNE2$d$ may overlap the space between the first electrode portion CNE2$a$ and the second electrode portion CNE2$b$ in the second direction DR2.

The third connection electrode CNE3 may contact the second ends of the second light emitting elements ED2 disposed in the second lane EA2 and the first ends of the third light emitting elements ED3 disposed in the third lane EA3. The third connection electrode CNE3 may include a first electrode portion CNE3$a$, a second electrode portion CNE3$b$, a third electrode portion CNE3$c$, a fourth electrode portion CNE3$d$, and a middle portion CNE3$e$.

The middle portion CNE3$e$ of the third connection electrode CNE3 may extend in the first direction DR1 within the emission area EMA. At least a portion of the middle portion CNE3$e$ may face the third electrode portion CNE2$c$ and the fourth electrode portion CNE2$d$ of the second connection electrode CNE2 in the second direction DR2. A width of the middle portion CNE3$e$ in the first direction DR1 may be greater than the third width w3 between the third electrode portion CNE2$c$ and the fourth electrode portion CNE2$d$ of the second connection electrode CNE2.

The first electrode portion CNE3$a$ of the third connection electrode CNE3 may extend in the second direction DR2 from a second side of the middle portion CNE3$e$ in the first direction DR1 toward the second side in the second direction DR2. The first electrode portion CNE3$a$ may contact the second ends of the second light emitting elements ED2 arranged in the first portion EA2$a$ of the second lane EA2.

The second electrode portion CNE3$b$ of the third connection electrode CNE3 may extend from a first side of the middle portion CNE3$e$ in the first direction DR1 toward the second side in the second direction DR2. The second electrode portion CNE3$b$ may contact the second ends of the second light emitting elements ED2 arranged in the second portion EA2$b$ of the second lane EA2.

The first electrode portion CNE3$a$ and the second electrode portion CNE3$b$ of the third connection electrode CNE3 may be spaced from each other by the second width w2 in the first direction DR1, like those of the second connection electrode CNE2. The second width w2 may be greater than the third width w3 between the third electrode portion CNE2$c$ and the fourth electrode portion CNE2$d$ of the second connection electrode CNE2. Accordingly, the third electrode portion CNE2$c$ and the fourth electrode portion CNE2d of the second connection electrode CNE2 may be disposed in a space between the first electrode portion CNE3a and the second electrode portion CNE3b of the third connection electrode CNE3. For example, the first electrode portion CNE3a of the third connection electrode CNE3 may face the third electrode portion CNE2c of the second connection electrode CNE2 in the first direction DR1, and the second electrode portion CNE3b of the third connection electrode CNE3 may face the fourth electrode portion CNE2d of the second connection electrode CNE2 in the first direction DR1.

The third electrode portion CNE3c of the third connection electrode CNE3 may extend in the second direction DR2 from the second side of the middle portion CNE3e in the first direction DR1 toward the first side in the second direction DR2. The third electrode portion CNE3c may contact the first ends of the third light emitting elements ED3 arranged in the first portion EA3a of the third lane EA3.

The fourth electrode portion CNE3d of the third connection electrode CNE3 may extend in the second direction DR2 from the first side of the middle portion CNE3e in the first direction DR1 toward the first side in the second direction DR2. The fourth electrode portion CNE3d may contact the first ends of the third light emitting elements ED3 arranged in the second portion EA3b of the third lane EA3.

The third electrode portion CNE3c and the fourth electrode portion CNE3d of the third connection electrode CNE3 may be spaced from each other by the third width w3 in the first direction DR1, like those of the second connection electrode CNE2. The third width w3 may be smaller than the second width w2. In one or more embodiments, the third width w3 may be substantially equal to the first width w1, but the present disclosure is not limited thereto.

A space between the third electrode portion CNE3c and the fourth electrode portion CNE3d may overlap the space between the first electrode portion CNE3a and the second electrode portion CNE3b in the second direction DR2. For example, the third electrode portion CNE3c and the fourth electrode portion CNE3d may overlap the space between the first electrode portion CNE3a and the second electrode portion CNE3b in the second direction DR2.

The fourth connection electrode CNE4 may contact the second ends of the third light emitting elements ED3 disposed in the third lane EA3 and the first ends of the fourth light emitting elements ED4 disposed in the fourth lane EA4. The fourth connection electrode CNE4 may include a first electrode portion CNE4a, a second electrode portion CNE4b, a third electrode portion CNE4c, a fourth electrode portion CNE4d, and a middle portion CNE4e.

The middle portion CNE4e of the fourth connection electrode CNE4 may extend in the first direction DR1 within the emission area EMA. At least a portion of the middle portion CNE4e may face the third electrode portion CNE3c and the fourth electrode portion CNE3d of the third connection electrode CNE3 in the second direction DR2. A width of the middle portion CNE4e in the first direction DR1 may be greater than the third width w3 between the third electrode portion CNE3c and the fourth electrode portion CNE3d of the third connection electrode CNE3.

The first electrode portion CNE4a of the fourth connection electrode CNE4 may extend in the second direction DR2 from a second side of the middle portion CNE4e in the first direction DR1 toward the second side in the second direction DR2. The first electrode portion CNE4a may contact the second ends of the third light emitting elements ED3 arranged in the first portion EA3a of the third lane EA3.

The second electrode portion CNE4b of the fourth connection electrode CNE4 may extend in the second direction DR2 from a first side of the middle portion CNE4e in the first direction DR1 toward the second side in the second direction DR2. The second electrode portion CNE4b may contact the second ends of the third light emitting elements ED3 arranged in the second portion EA3b of the third lane EA3.

The first electrode portion CNE4a and the second electrode portion CNE4b of the fourth connection electrode CNE4 may be spaced from each other by the second width w2 in the first direction DR1, like those of the second connection electrode CNE2. The second width w2 may be greater than the third width w3 between the third electrode portion CNE3c and the fourth electrode portion CNE3d of the third connection electrode CNE3. Accordingly, the third electrode portion CNE3c and the fourth electrode portion CNE3d of the third connection electrode CNE3 may be disposed in a space between the first electrode portion CNE4a and the second electrode portion CNE4b of the fourth connection electrode CNE4. For example, the first electrode portion CNE4a of the fourth connection electrode CNE4 may face the third electrode portion CNE3c of the third connection electrode CNE3 in the first direction DR1, and the second electrode portion CNE4b of the fourth connection electrode CNE4 may face the fourth electrode portion CNE3d of the third connection electrode CNE3 in the first direction DR1.

The third electrode portion CNE4c of the fourth connection electrode CNE4 may extend in the second direction DR2 from the second side of the middle portion CNE4e in the first direction DR1 toward the first side in the second direction DR2. The third electrode portion CNE4c may contact the first ends of the fourth light emitting elements ED4 arranged in the first portion EA4a of the fourth lane EA4.

The fourth electrode portion CNE4d of the fourth connection electrode CNE4 may extend in the second direction DR2 from the first side of the middle portion CNE4e in the first direction DR1 toward the first side in the second direction DR2. The fourth electrode portion CNE4d may contact the first ends of the fourth light emitting elements ED4 arranged in the second portion EA4b of the fourth lane EA4.

The third electrode portion CNE4c and the fourth electrode portion CNE4d of the fourth connection electrode CNE4 may be spaced from each other by the third width w3 in the first direction DR1, like those of the second connection electrode CNE2. The third width w3 may be smaller than the second width w2. In one or more embodiments, the third width w3 may be substantially equal to the first width w1, but the present disclosure is not limited thereto.

A space between the third electrode portion CNE4c and the fourth electrode portion CNE4d may overlap the space between the first electrode portion CNE4a and the second electrode portion CNE4b in the second direction DR2. For example, the third electrode portion CNE4c and the fourth electrode portion CNE4d may overlap the space between the first electrode portion CNE4a and the second electrode portion CNE4b in the second direction DR2.

Referring to FIGS. 6 and 9, the fifth connection electrode CNE5 may have the third type shape branching to both sides in the first direction DR1 on the second side in the second direction DR2. The fifth connection electrode CNE5 may contact the second ends of the fourth light emitting elements ED4 disposed in the fourth lane EA4. The fifth connection electrode CNE5 may include a second power contact portion CNE5d, a first electrode portion CNE5a, a second electrode portion CNE5b, and a branch portion CNE5c. The fifth connection electrode CNE5 may be referred to as a third type connection electrode in the claims.

The second power contact portion CNE5d of the fifth connection electrode CNE5 may generally extend in the second direction DR2. The second power contact portion CNE5d may extend across the outer bank BNL to the sub-area SA.

The second power contact portion CNE5d may be electrically connected to the third alignment electrode RME3 through a second contact portion CT2. Because the second power supply voltage is applied to the third alignment electrode RME3 as described above, the second power supply voltage may also be applied to the fifth connection electrode CNE5. Accordingly, the second power supply voltage may be applied to the second ends of the fourth light emitting elements ED4 arranged in the fourth lane EA4.

In one or more embodiments, the second contact portion CT2 may be disposed in the sub-area SA, but the present disclosure is not limited thereto.

The branch portion CNE5c of the fifth connection electrode CNE5 may be disposed on a second side of the second power contact portion CNE5d in the second direction DR2 and may generally extend in the first direction DR1. In one or more embodiments, the second power contact portion CNE5d may be disposed at an end of the branch portion CNE5c on the first side in the first direction DR1, but the present disclosure is not limited thereto.

The first electrode portion CNE5a of the fifth connection electrode CNE5 may extend in the second direction DR2 from a second side of the branch portion CNE5c in the first direction DR1 toward the second side in the second direction DR2. The first electrode portion CNE5a may be disposed on the first side of the first alignment electrode RME1 in the first direction DR1 to contact the second ends of the fourth light emitting elements ED4 arranged in the first portion EA4a of the fourth lane EA4.

The second electrode portion CNE5b of the fifth connection electrode CNE5 may extend in the second direction DR2 from a first side of the branch portion CNE5c in the first direction DR1 toward the second side in the second direction DR2. The second electrode portion CNE5b may be disposed on the second side of the third alignment electrode RME3 in the first direction DR1 to contact the second ends of the fourth light emitting elements ED4 arranged in the second portion EA4b of the fourth lane EA4.

The first electrode portion CNE5a and the second electrode portion CNE5b may be spaced from each other in the first direction DR1. For example, the first electrode portion CNE5a and the second electrode portion CNE5b may be spaced from each other by a fourth width w4 in the first direction DR1. The fourth width w4 may be greater than the third width w3 between the third electrode portion CNE4c and the fourth electrode portion CNE4d of the fourth connection electrode CNE4.

The third electrode portion CNE4c and the fourth electrode portion CNE4d of the fourth connection electrode CNE4 may be disposed in a space between the first electrode portion CNE5a and the second electrode portion CNE5b of the fifth connection electrode CNE5. For example, the first electrode portion CNE5a of the fifth connection electrode CNE5 may face the third electrode portion CNE4c of the fourth connection electrode CNE4 in the first direction DR1, and the second electrode portion CNE5b of the fifth connection electrode CNE5 may face the fourth electrode portion CNE4d of the fourth connection electrode CNE4 in the first direction DR1.

In one or more embodiments, the connection electrodes CNE may be formed as different layers. In this case, the first connection electrode CNE1, the third connection electrode CNE3, and the fifth connection electrode CNE5 may be formed as the same first connection electrode layer, and the second connection electrode CNE2 and the fourth connection electrode CNE4 may be formed as the same second connection electrode layer after the first connection electrode layer is formed, but the present disclosure is not limited thereto. For example, the first connection electrode CNE1, the second connection electrode CNE2, the third connection electrode CNE3, the fourth connection electrode CNE4, and the fifth connection electrode CNE5 may also be formed as the same layer. A case where the first connection electrode CNE1, the third connection electrode CNE3, and the fifth connection electrode CNE5 are formed as the same first connection electrode layer, and the second connection electrode CNE2 and the fourth connection electrode CNE4 are formed as the same second connection electrode layer after the formation of the first connection electrode layer will be mainly described below.

In the display device 1 according to one or more embodiments configured as described above, the second ends of the first light emitting elements ED1 may be electrically connected to the first ends of the second light emitting elements ED2, the second ends of the second light emitting elements ED2 may be electrically connected to the first ends of the third light emitting elements ED3, and the second ends of the third light emitting elements ED3 may be electrically connected to the first ends of the fourth light emitting elements ED4. That is, the first light emitting elements ED1, the second light emitting elements ED2, the third light emitting elements ED3, and the fourth light emitting elements ED4 may be connected in series. Accordingly, higher luminance can be expressed for the same current than when the first power supply voltage is applied to the first end of one light emitting element ED and the second power supply voltage is applied to the second end of the light emitting element ED.

In addition, the light emitting elements ED of the display device 1 according to one or more embodiments may maintain the above-described series connection relationship even when they are disposed only in at least any one of the first portion and the second portion of each of the sections EA1 through EA4. Therefore, the lighting reliability of the pixel PX can be improved. This will be described in detail later.

The element stack structure of a subpixel SPXn will now be described.

FIG. 10 is a schematic cross-sectional view taken along the line X1-X1' of FIG. 6. FIG. 11 is a schematic cross-sectional view taken along the line X2-X2' of FIG. 6.

FIG. 10 illustrates a cross section across a first light emitting element ED1 disposed in the first portion EA a of the first lane EA1 and a first light emitting element ED1 disposed in the second portion EA b of the first lane EA1. FIG. 11 illustrates a cross section across the first contact portion CT1, the first electrode contact hole CTD, a first light emitting element ED1, a second light emitting element ED2, a third light emitting element ED3, a fourth light emitting element ED4, the second electrode contact hole CTS, and the second contact portion CT2.

Referring to FIGS. 10 and 11 in addition to FIG. 6, the display device 1 may include a substrate SUB and a semiconductor layer, a plurality of conductive layers, and a plurality of insulating layers disposed on the substrate SUB. In addition, the display device 1 may include a plurality of electrodes RME, a plurality of light emitting elements ED, and a plurality of connection electrodes CNE as described above. The semiconductor layer, the conductive layers, and the insulating layers may constitute the circuit element layer CCL of the display device 1.

The substrate SUB may be made of an insulating material such as glass, quartz, or polymer resin. In addition, the substrate SUB may be a rigid substrate, but may also be a flexible substrate that can be bent, folded, rolled, etc.

The circuit element layer CCL may be disposed on the substrate SUB. In the circuit element layer CCL, various wirings that transmit electrical signals to the light emitting elements ED disposed on the substrate SUB may be disposed. As illustrated in FIGS. 10 and 11, the circuit element layer CCL may include a first conductive layer, a semiconductor layer, a second conductive layer, and a third conductive layer as a plurality of conductive layers and may include a buffer layer BF, a first gate insulating layer GI, a first interlayer insulating layer ILD, and a first passivation layer PVX as a plurality of insulating layers.

The first conductive layer may be disposed on the substrate SUB. The first conductive layer includes a bottom metal layer BML, and the bottom metal layer BML is overlapped by an active layer ACT of a first transistor T1 in the third direction DR3. The bottom metal layer BML may prevent incidence of light to the active layer ACT of the first transistor T1 or may be electrically connected to the active layer ACT to stabilize electrical characteristics of the first transistor T1. However, the bottom metal layer BML may also be omitted.

The buffer layer BF may be disposed on the bottom metal layer BML and the substrate SUB. The buffer layer BF may be formed on the substrate SUB to protect transistors of the pixel PX from moisture introduced through the substrate SUB which is vulnerable to moisture penetration and may perform a surface planarization function.

The semiconductor layer is disposed on the buffer layer BF. The semiconductor layer may include the active layer ACT of the first transistor T1 and an active layer ACT of a second transistor T2. The active layer ACT of the first transistor T1 and the active layer ACT of the second transistor T2 may respectively be partially overlapped by a first gate electrode G1 and a second gate electrode G2 of the second conductive layer which will be described later.

The semiconductor layer may include polycrystalline silicon, monocrystalline silicon, an oxide semiconductor, or the like. In one or more embodiments, the semiconductor layer may include polycrystalline silicon. The oxide semiconductor may be an oxide semiconductor containing indium (In). For example, the oxide semiconductor may be at least one selected from among indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although the first transistor T1 and the second transistor T2 are disposed in each subpixel SPXn of the display device 10 in the drawings, the present disclosure is not limited thereto, and the display device 10 may include a greater number of transistors.

The first gate insulating layer GI is disposed on the semiconductor layer in the display area DA. The first gate insulating layer GI may serve as a gate insulating film of each of the transistors T1 and T2. In the drawings, the first gate insulating layer GI is patterned together with the gate electrodes G1 and G2 of the second conductive layer to be described later and thus partially disposed between the second conductive layer and the active layers ACT of the semiconductor layer. However, the present disclosure is not limited thereto. In one or more embodiments, the first gate insulating layer GI may be disposed on the entire surface of the buffer layer BF.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the active layer ACT of the first transistor T1 in the third direction DR3 which is the thickness direction of the substrate SUB, and the second gate electrode G2 may overlap a channel region of the active layer ACT of the second transistor T2 in the third direction DR3 which is the thickness direction of the substrate SUB.

The first interlayer insulating layer ILD is disposed on the second conductive layer. The first interlayer insulating layer ILD may function as an insulating film between the second conductive layer and other layers disposed on the second conductive layer and may protect the second conductive layer.

The third conductive layer is disposed on the first interlayer insulating layer ILD. The third conductive layer may include a first voltage wiring VL1 and a second voltage wiring VL2 disposed in the display area DA, a first conductive pattern CDP1, and a source electrode S1 or S2 and a drain electrode D1 or D2 of each of the transistors T1 and T2.

A high potential voltage (or a first power supply voltage) supplied to the first alignment electrode RME1 may be applied to the first voltage wiring VL1, and a low potential voltage (or a second power supply voltage) supplied to the second alignment electrode RME2 may be applied to the second voltage wiring VL2. A portion of the first voltage wiring VL1 may contact the active layer ACT of the first transistor T1 through a contact hole penetrating the first interlayer insulating layer ILD. The first voltage wiring VL1 may serve as a first drain electrode D1 of the first transistor T1. The first voltage wiring VL1 may be directly connected to the first alignment electrode RME1, and the second voltage wiring VL2 may be directly connected to the second alignment electrode RME2.

The first conductive pattern CDP1 may contact the active layer ACT of the first transistor T1 through a contact hole penetrating the first interlayer insulating layer ILD. The first conductive pattern CDP1 may contact the bottom metal layer BML through another contact hole penetrating the first interlayer insulating layer IL1 and the buffer layer BF. The first conductive pattern CDP1 may serve as a first source electrode S1 of the first transistor T1. In addition, the first conductive pattern CDP1 may be connected to the first alignment electrode RME1 or the first connection electrode CNE1 to be described later. The first transistor T1 may transmit the first power supply voltage received from the first voltage wiring VL1 to the second alignment electrode RME2 or the first connection electrode CNE1.

Each of a second source electrode S2 and a second drain electrode D2 may contact the active layer ACT of the second transistor T2 through a contact hole penetrating the first interlayer insulating layer ILD.

The first passivation layer PVX is disposed on the third conductive layer. The first passivation layer PVX may function as an insulating film between the third conductive layer and other layers and may protect the third conductive layer.

Each of the buffer layer BF, the first gate insulating layer GI, the first interlayer insulating layer ILD, and the first passivation layer PVX described above may be composed of a plurality of inorganic layers stacked alternately. For example, each of the buffer layer BF, the first gate insulating layer GI, the first interlayer insulating layer ILD, and the first passivation layer PVX may be a double layer in which inorganic layers including at least one selected from among silicon oxide ($SiO_x$), silicon nitride ($SiN_x$) and silicon oxynitride ($SiO_xN_y$) are stacked or may be a multilayer in which the above inorganic layers are alternately stacked.

A via insulating layer VIA may be disposed on the circuit element layer CCL. Specifically, the via insulating layer VIA may be disposed on the first passivation layer PVX of the circuit element layer CCL. The via insulating layer VIA may include an organic insulating material such as polyimide (PI) to compensate for a step difference due to various wirings in the circuit element layer CCL and form a flat upper surface.

The inner banks BP are disposed on the upper surface of the via insulating layer VIA. In other words, the via insulating layer VIA and the inner banks BP may directly contact each other.

The inner banks BP may be disposed on the via insulating layer VIA. The inner banks BP may have sides that are inclined or curved with a certain curvature, and light emitted from the light emitting elements ED may be reflected by the alignment electrodes RME on the inner banks BP toward the first side in the third direction DR3. The inner banks BP may include a transparent organic insulating material such as polyimide, but the present disclosure is not limited thereto. For example, the inner banks BP may further include a colored dye such as a black pigment.

A plurality of alignment electrodes RME may be disposed on the inner banks BP and the via insulating layer VIA.

As illustrated in FIG. 10, the first alignment electrode RME1 is disposed on the first inner bank BP1 to extend toward the second inner bank BP2, the second alignment electrode RME2 is disposed on the second inner bank BP2 to extend toward the first inner bank BP1 and the third inner bank BP3, and the third alignment electrode RME3 is disposed on the third inner bank BP3 to extend toward the second inner bank BP2.

A distance between the first alignment electrode RME1 and the second alignment electrode RME2 may be smaller than a distance between the first inner bank BP1 and the second inner bank BP2. For example, at least a portion of each of the first alignment electrode RME1 and the second alignment electrode RME2 may be directly disposed on the via insulating layer VIA, and these portions may lie in the same plane. In one or more embodiments, the distance between the first alignment electrode RME1 and the second alignment electrode RME2 may be smaller than or equal to the length of each light emitting element ED. Accordingly, the alignment of the light emitting elements ED may be improved. In one or more embodiments, the distance between the first alignment electrode RME1 and the second alignment electrode RME2 may be, but is not limited to, 1 μm to 10 μm.

Similarly, a distance between the second alignment electrode RME2 and the third alignment electrode RME3 may be smaller than a distance between the second inner bank BP2 and the third inner bank BP3. For example, at least a portion of each of the second alignment electrode RME2 and the third alignment electrode RME3 may be directly disposed on the via insulating layer VIA, and these portions may lie in the same plane. In one or more embodiments, the distance between the second alignment electrode RME2 and the third alignment electrode RME3 may be smaller than or equal to the length of each light emitting element ED. Accordingly, the alignment of the light emitting elements ED may be improved. In one or more embodiments, the distance between the second alignment electrode RME2 and the third alignment electrode RME3 may be, but is not limited to, 1 μm to 10 μm.

The alignment electrodes RME may reflect light emitted from the light emitting elements ED. Specifically, the light emitting elements ED may be disposed between the inner banks BP to emit light in directions toward both ends thereof, and the emitted light may be directed to the alignment electrodes RME disposed on the inner banks BP. Accordingly, the light emitted from the light emitting elements ED may be reflected by the alignment electrodes RME to travel in the third direction DR3.

The alignment electrodes RME may include a conductive material having high reflectivity. For example, each of the alignment electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti), molybdenum (Mo) or niobium (Nb) and the above alloy are stacked. In one or more embodiments, each of the alignment electrodes RME may be a double layer or a multilayer in which an alloy including aluminum (Al) and at least one metal layer made of titanium (Ti), molybdenum (Mo) or niobium (Nb) are stacked.

However, the present disclosure is not limited thereto, and each alignment electrode RME may further include a transparent conductive material. For example, each alignment electrode RME may include a material such as ITO, IZO or ITZO. In one or more embodiments, each alignment electrode RME may have a structure in which a transparent conductive material and a metal layer having high reflectivity are each stacked in one or more layers or may be formed as a single layer including them. For example, each alignment electrode RME may have a stacked structure of ITO/Ag/ITO, ITO/Ag/IZO, or ITO/Ag/ITZO/IZO. The alignment electrodes RME may be electrically connected to the light emitting elements ED and may reflect some of the light emitted from the light emitting elements ED in an upward direction above the substrate SUB.

A first insulating layer PAS1 may be disposed in the entire display area DA and may be disposed on the via insulating layer VIA and the alignment electrodes RME. The first insulating layer PAS1 may include an insulating material to protect the alignment electrodes RME while insulating different alignment electrodes RME from each other. Because the first insulating layer PAS1 covers the alignment electrodes RME before the outer bank BNL is formed, it may prevent the alignment electrodes RME from being damaged in the process of forming the outer bank BNL. In addition, the first insulating layer PAS1 may prevent direct contact of the light emitting elements ED on the first insulating layer PAS1 with other members, and thus, prevent damage to the light emitting elements ED.

In one or more embodiments, the first insulating layer PAS1 may be stepped such that a portion of an upper surface of the first insulating layer PAS1 is recessed between the alignment electrodes RME spaced from each other in the first direction DR1. The light emitting elements ED may be disposed on the stepped upper surface of the first insulating layer PAS1, and a space may be formed between the light emitting elements ED and the first insulating layer PAS1.

The first insulating layer PAS1 may include the contact portions CT1 and CT2. The contact portions CT1 and CT2 may overlap different alignment electrodes RME, respectively. For example, the contact portions CT1 and CT2 may include the first contact portion CT1 overlapping the second alignment electrode RME2 and the second contact portion CT2 overlapping the third alignment electrode RME3. The first contact portion CT1 and the second contact portion CT2 may penetrate the first insulating layer PAS1 to partially expose upper surfaces of the alignment electrodes RME.

Each of the first contact portion CT1 and the second contact portion CT2 may further penetrate some of the other insulating layers disposed on the first insulating layer PAS1. An alignment electrode RME exposed by each of the contact portions CT1 and CT2 may contact a connection electrode CNE. The light emitting elements ED may be electrically connected to the circuit element layer CCL under the alignment electrodes RME and the via insulating layer VIA by contacting the connection electrodes CNE. Therefore, the light emitting elements ED may receive an electric signal and emit light in a specific wavelength band.

The outer bank BNL may be disposed on the first insulating layer PAS1. The outer bank BNL may include portions extending in the first direction DR1 and the second direction DR2 and may be around (e.g., may surround) each subpixel SPXn. The outer bank BNL may be around (e.g., may surround) each subpixel SPXn to separate them and may be around (e.g., may surround) the outermost periphery of the display area DA to separate the display area DA and the non-display area NDA.

The outer bank BNL may have a suitable height (e.g., a predetermined height) similar to those of the inner banks BP. In one or more embodiments, an upper surface of the outer bank BNL may be at a greater height than those of the inner banks BP, and a thickness of the outer bank BNL may be equal to or greater than those of the inner banks BP. Accordingly, the outer bank BNL may prevent ink from overflowing to adjacent pixels PX in an inkjet printing process during the manufacturing process of the display device 1. Like the inner banks BP, the outer bank BNL may include a transparent organic insulating material such as polyimide, but the present disclosure is not limited thereto. For example, the outer bank BNL may also include a colored dye such as a black pigment.

A second insulating layer PAS2 may be disposed on the light emitting elements ED, the first insulating layer PAS1, and the outer bank BNL. The second insulating layer PAS2 includes a pattern portion extending in the second direction DR2 between the inner banks BP and disposed on the light emitting elements ED. The pattern portion may partially cover outer surfaces (e.g., outer peripheral or circumferential surfaces) of the light emitting elements ED and may not cover both sides or both ends of the light emitting elements ED. The pattern portion may form a linear or island-shaped pattern in each subpixel SPXn. The pattern portion of the second insulating layer PAS2 may protect the light emitting elements ED while anchoring the light emitting elements ED in the manufacturing process of the display device 1. In addition, the second insulating layer PAS2 may be formed to fill the space between the light emitting elements ED and the first insulating layer PAS1 under the light emitting elements ED.

The second insulating layer PAS2 may include the contact portions CT1 and CT2. The contact portions CT1 and CT2 may overlap different alignment electrodes RME, respectively. For example, the contact portions CT1 and CT2 may include the first contact portion CT1 overlapping the second alignment electrode RME2 and the second contact portion CT2 overlapping the third alignment electrode RME3. The first contact portion CT1 and the second contact portion CT2 may penetrate the second insulating layer PAS2 to partially expose the upper surfaces of the alignment electrodes RME.

Each of the first contact portion CT1 and the second contact portion CT2 may further penetrate some of the other insulating layers disposed on the first insulating layer PAS1. An alignment electrode RME exposed by each of the contact portions CT1 and CT2 may contact a connection electrode CNE. The light emitting elements ED may be electrically connected to the circuit element layer CCL under the alignment electrodes RME and the via insulating layer VIA by contacting the connection electrodes CNE. Therefore, the light emitting elements ED may receive an electric signal and emit light in a specific wavelength band.

The first connection electrode CNE1, the third connection electrode CNE3, and the fifth connection electrode CNE5 from among the connection electrodes CNE may be disposed on the second insulating layer PAS2 as the same layer. The first connection electrode CNE1, the third connection electrode CNE3, and the fifth connection electrode CNE5 may be disposed on the second insulating layer PAS2 to contact the light emitting elements ED. Because the contact relationship between the first, third, and fifth connection electrodes CNE1, CNE3, and CNE5 and the light emitting elements ED has been described above, a detailed description thereof will be omitted below.

The first connection electrode CNE1 may extend beyond the outer bank BNL as illustrated in FIG. 11. The first connection electrode CNE1 may contact the second alignment electrode RME2 through the first contact portion CT1 penetrating the first insulating layer PAS1 and the second insulating layer PAS2. Accordingly, the first connection electrode CNE1 may be electrically connected to the first transistor T1 and thus may receive the first power supply voltage.

The fifth connection electrode CNE5 may extend beyond the outer bank BNL as illustrated in FIG. 11. The fifth connection electrode CNE5 may contact the third alignment electrode RME3 through the second contact portion CT2 penetrating the first insulating layer PAS1 and the second insulating layer PAS2. Accordingly, the fifth connection electrode CNE5 may be electrically connected to the second power wiring VL2 and thus may receive the second power supply voltage.

A third insulating layer PAS3 may be disposed on the second insulating layer PAS2, the first connection electrode CNE1, the third connection electrode CNE3, the fifth connection electrode CNE5, and the outer bank BNL. The third insulating layer PAS3 may form a linear or island-shaped pattern in the emission area EMA of each subpixel SPXn. The linear or island-shaped pattern formed by the third insulating layer PAS3 may not cover an end of each light emitting element ED. In other words, the third insulating layer PAS3 may not cover an end of each light emitting elements ED which does not contact the first connection electrode CNE1, the third connection electrode CNE3, and the fifth connection electrode CNE5 in the emission area EMA.

The second connection electrode CNE2 and the fourth connection electrode CNE4 from among the connection electrodes CNE may be disposed on the third insulating layer PAS3. The second connection electrode CNE2 and the fourth connection electrode CNE4 may be disposed on the third insulating layer PAS3 to contact the light emitting elements ED. Because the contact relationship between the second and fourth connection electrodes CNE2 and CNE4 and the light emitting elements ED has been described above, a detailed description thereof will be omitted below.

The second connection electrode CNE2 and the fourth connection electrode CNE4 may be insulated from the first connection electrode CNE1, the third connection electrode CNE3, and the fifth connection electrode CNE5 by the third insulating layer PAS3.

The connection electrodes CNE may include a conductive material such as ITO, IZO, ITZO, or aluminum (Al). For example, the connection electrodes CNE may include a transparent conductive material, and light emitted from the light emitting elements ED may be output through the connection electrodes CNE.

Each of the first insulating layer PAS1, the second insulating layer PAS2, and the third insulating layer PAS3 described above may include an inorganic insulating material or an organic insulating material. In one or more embodiments, each of the first insulating layer PAS1, the second insulating layer PAS2, and the third insulating layer PAS3 may be one or more selected from among silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material. Alternatively, some of them may be made of the same material while some other of them are made of different materials, or all of them may be made of different materials.

The process of manufacturing the display device 1 according to one or more embodiments will now be described.

FIGS. 12 through 14 are cross-sectional views illustrating the process of manufacturing the display device 1 according to one or more embodiments. FIGS. 12 and 13 illustrate a process of ejecting the light emitting elements ED during the process of manufacturing the display device 1 according to one or more embodiments. FIG. 14 illustrates a state in which the ejected light emitting elements ED are aligned.

Because a process of forming the circuit element layer CCL, the via insulating layer VIA, the alignment electrodes RME, the first insulating layer PAS1 and the outer bank BNL on the substrate SUB is well known in the art, a description thereof will be omitted.

Referring to FIGS. 12 through 14, ink INK including a solvent SV and the light emitting elements ED dispersed in the solvent SV is ejected onto the alignment electrodes RME. The ejection of the ink INK may be performed by an inkjet printing device as illustrated in the drawings.

The alignment of the light emitting elements ED dispersed in the ink INK may be performed using a dielectrophoresis force caused by an electric field generated between the alignment electrodes RME by alignment signals having different potential values. Accordingly, the light emitting elements ED may be aligned in the space between the alignment electrodes RME. In the case of FIGS. 12 and 13, the light emitting elements ED may be aligned to have opposite orientations as illustrated in FIG. 14 by a first electric field IEL1 formed in the first portion EA a of the first lane EA1 or a second electric field IEL2 formed in the second portion EA b of the first lane EA1.

However, when the alignment of the light emitting elements ED dispersed in the ink INK is performed using a dielectrophoresis force, the light emitting elements ED may not be properly aligned depending on the influence of the circuit element layer CCL and the degree of dispersion of the light emitting elements ED in the ink INK. In other words, a portion in which the light emitting elements ED are not disposed may occur at random in the space between the alignment electrodes RME. In this case, the series connection relationship of the light emitting elements ED may be broken, thus affecting the luminance of the pixel PX. Therefore, the connection electrodes CNE need to be shaped as described above so that the series connection relationship of the light emitting elements ED is not broken even if there is a portion in which the light emitting elements ED are not disposed. This will be described later with reference to FIG. 15.

Hereinafter, other embodiments of the display device 1 according to the embodiment will be described. In the following embodiments, the same elements as those of the above-described embodiment will be indicated by the same reference numerals, and their redundant description will be omitted or given briefly, and differences will be mainly described.

FIG. 15 is a plan view illustrating the structure of a subpixel of a display device 1_1 according to one or more embodiments.

Referring to FIG. 15, the display device 1_1 according to the current embodiment illustrates a portion in which light emitting elements ED are not disposed can exist in a portion of a section EA1, EA2, EA3, or EA4. FIG. 15 illustrates a case where first light emitting elements ED1 are not disposed in a second portion EA b of a first lane EA1.

The display device 1_1 according to the current embodiment is substantially the same as the display device 1 according to the embodiment of FIG. 6 except that the first light emitting elements ED1 are not disposed in the second portion EA b of the first lane EA1. Therefore, differences will be mainly described below, and redundant descriptions will be omitted.

In the process of manufacturing the display device described above with reference to FIGS. 12 through 14, the light emitting elements ED dispersed in the ink INK are aligned using a dielectrophoresis force. Therefore, the light emitting elements ED may not be properly aligned depending on the influence of the circuit element layer CCL and the degree of dispersion of the light emitting elements ED in the ink INK. Hence, in the case of the display device 1_1 according to the current embodiment, the first light emitting elements ED1 may not be disposed in the second portion EA b of the first lane EA1.

However, because the first light emitting elements ED1 are disposed in a first portion EA1a of the first lane EA1, the series connection relationship of the first light emitting elements ED1, second light emitting elements ED2, third light emitting elements ED3, and fourth light emitting elements ED4 may not be broken.

That is, when the alignment of the light emitting elements ED dispersed in the ink INK is performed using a dielectrophoresis force, even if a portion in which the light emitting elements ED are not disposed occurs at random in a space between alignment electrodes RME because the light emitting elements ED dispersed in the ink INK are not properly aligned depending on the influence of the circuit element layer CCL and the degree of dispersion of the light emitting elements ED in the ink INK, there is a high probability that the series connection relationship of the light emitting elements ED will not be broken. Accordingly, the lighting reliability of a pixel PX may be improved.

FIG. 16 is a plan view illustrating the structure of a subpixel of a display device 1_2 according to one or more embodiments.

Referring to FIG. 16, the display device 1_2 according to the current embodiment illustrates a second alignment electrode RME2_2 among alignment electrodes RME_2 can be separated. For example, the second alignment electrode RME2_2 may include a first portion RME2a on the second side in the first direction DR1 and a second portion RME2b on the first side in the first direction DR1.

In one or more embodiments, a first connection electrode CNE1 may be electrically connected to the second portion RME2b of the second alignment electrode RME2_2 through a first contact portion CT1, and the second portion RME2b may receive a first power supply voltage through a first electrode contact hole CTD. However, the present disclosure is not limited thereto. For example, the first connection electrode CNE1 may also be electrically connected to the first portion RME2a of the second alignment electrode RME2_2 through the first contact portion CT1, and the first portion RME2a may receive the first power supply voltage through the first electrode contact hole CTD.

FIG. 17 is a plan view illustrating the structure of a subpixel of a display device 1_3 according to one or more embodiments.

Referring to FIG. 17, the display device 1_3 according to the current embodiment illustrates two light emitting elements ED can be connected in series. For example, connection electrodes CNE_3 of the display device 1_3 according to the current embodiment are different from the connection electrodes CNE of the display device 1 according to the embodiment of FIG. 6 in that they include a third connection electrode CNE3_3 having a third type shape and that a fourth connection electrode CNE4 and a fifth connection electrode CNE5 are omitted. In addition, light emitting elements ED of the display device 1_3 according to the current embodiment are different from the light emitting elements ED of the display device 1 according to the embodiment of FIG. 6 in that third light emitting elements ED3 and fourth light emitting elements ED4 are omitted. Other elements are substantially the same as or similar to those of the display device 1 according to the embodiment of FIG. 6.

Accordingly, a first connection electrode CNE1, a second connection electrode CNE2, first light emitting elements ED1 and second light emitting elements ED2 are the same as those described above, and thus a detailed description thereof will be omitted.

The third connection electrode CNE3_3 of the display device 1_3 according to the current embodiment may have the third type shape branching to both sides in the first direction DR1 on the second side in the second direction DR2. The third connection electrode CNE3_3 may contact second ends of the second light emitting elements ED2 disposed in a second lane EA2. The third connection electrode CNE3_3 may include a second power contact portion CNE3_3d, a first electrode portion CNE3_3a, a second electrode portion CNE3_3b, and a branch portion CNE3_3c.

The second power contact portion CNE3_3d of the third connection electrode CNE3_3 may generally extend in the second direction DR2. The second power contact portion CNE3_3d may extend across an outer bank BNL to a sub-area SA.

The second power contact portion CNE3_3d may be electrically connected to a third alignment electrode RME3 through a second contact portion CT2. Because a second power supply voltage is applied to the third alignment electrode RME3 as described above, it may also be applied to the third connection electrode CNE3_3. Accordingly, the second power supply voltage may be applied to the second ends of the second light emitting elements ED2 arranged in the second lane EA2.

In one or more embodiments, the second contact portion CT2 may be disposed in the sub-area SA, but the present disclosure is not limited thereto.

The branch portion CNE3_3c of the third connection electrode CNE3_3 may be disposed on a second side of the second power contact portion CNE3_3d in the second direction DR2 and may generally extend in the first direction DR1. In one or more embodiments, the second power contact portion CNE3_3d may be disposed at an end of the branch portion CNE3_3c on the first side in the first direction DR1, but the present disclosure is not limited thereto.

The first electrode portion CNE3_3a of the third connection electrode CNE3_3 may extend in the second direction DR2 from a second side of the branch portion CNE3_3c in the first direction DR1 toward the second side in the second direction DR2. The first electrode portion CNE3_3a may be disposed on a first side of a first alignment electrode RME1 in the first direction DR1 to contact the second ends of the second light emitting elements ED2 arranged in a first portion EA2a of the second lane EA2.

The second electrode portion CNE3_3b of the third connection electrode CNE3_3 may extend in the second direction DR2 from a first side of the branch portion CNE3_3c in the first direction DR1 toward the second side in the second direction DR2. The second electrode portion CNE3_3b may be disposed on a second side of the third alignment electrode RME3 in the first direction DR1 to contact the second ends of the second light emitting elements ED2 arranged in a second portion EA2b of the second lane EA2.

The first electrode portion CNE3_3a and the second electrode portion CNE3_3b may be spaced from each other in the first direction DR1. For example, the first electrode portion CNE3_3a and the second electrode portion CNE3_3b may be spaced from each other by a fourth width w4 (see FIG. 9) in the first direction DR1. The fourth width w4 may be greater than a third width w3 (see FIG. 8) between a third electrode portion CNE2c and a fourth electrode portion CNE2d of the second connection electrode CNE2.

The third electrode portion CNE2c and the fourth electrode portion CNE2d of the second connection electrode CNE2 may be disposed in a space between the first electrode portion CNE3_3a and the second electrode portion CNE3_3b of the third connection electrode CNE3_3. For example, the first electrode portion CNE3_3a of the third connection electrode CNE3_3 may face the third electrode portion CNE2c of the second connection electrode CNE2 in the first direction DR1, and the second electrode portion CNE3_3b of the third connection electrode CNE3_3 may face the fourth electrode portion CNE2d of the second connection electrode CNE2 in the first direction DR1.

In the display device 1_3 according to the current embodiment, second ends of the first light emitting elements ED1 may be electrically connected to first ends of the second light emitting elements ED2. That is, the first light emitting elements ED1 and the second light emitting elements ED2 may be connected in series.

In the display device 1_3 according to the current embodiment as compared with the display device 1 according to the embodiment of FIG. 6, series connection relationships of the light emitting elements ED can be easily reduced only by changing the number of connection electrodes of a second type shape.

FIG. 18 is a plan view illustrating the structure of a subpixel of a display device 1_4 according to one or more embodiments.

Referring to FIG. 18, the display device 1_4 according to the current embodiment illustrates six light emitting elements ED can be connected in series. For example, connection electrodes CNE_4 of the display device 1_4 according to the current embodiment are different from the connection electrodes CNE of the display device 1 according to the embodiment of FIG. 6 in that a fifth connection electrode CNE5_4 has a second type shape and that the connection electrodes CNE_4 further include a sixth connection electrode CNE6 having the second type shape and a seventh connection electrode CNE7 having a third type shape. In addition, light emitting elements ED of the display device 1_4 according to the current embodiment are different from the light emitting elements ED of the display device 1 according to the embodiment of FIG. 6 in that they further include fifth light emitting elements ED5 and sixth light emitting elements ED6. Other elements are substantially the same as or similar to those of the display device 1 according to the embodiment of FIG. 6.

Accordingly, a first connection electrode CNE1, a second connection electrode CNE2, a third connection electrode CNE3, a fourth connection electrode CNE4, first light emitting elements ED1, second light emitting elements ED2, third light emitting elements ED3 and fourth light emitting elements ED4 are the same as those described above, and thus a detailed description thereof will be omitted.

The fifth connection electrode CNE5_4 and the sixth connection electrode CNE6 of the display device 1_4 according to the current embodiment may have the second type shape branching to both sides in the first direction DR1 on the first side in the second direction DR2 and the second side in the second direction DR2.

The fifth connection electrode CNE5_4 may contact second ends of the fourth light emitting elements ED4 disposed in a fourth lane EA4 and first ends of the fifth light emitting elements ED5 disposed in a fifth lane EA5. The fifth connection electrode CNE5_4 may include a first electrode portion CNE5_4a, a second electrode portion CNE5_4b, a third electrode portion CNE5_4c, a fourth electrode portion CNE5_4d, and a middle portion CNE5_4e.

The middle portion CNE5_4e of the fifth connection electrode CNE5_4 may extend in the first direction DR1 within an emission area EMA. At least a portion of the middle portion CNE5_4e may face a third electrode portion CNE4c and a fourth electrode portion CNE4d of the fourth connection electrode CNE4 in the second direction DR2. A width of the middle portion CNE5_4e in the first direction DR1 may be greater than a third width w3 between the third electrode portion CNE4c and the fourth electrode portion CNE4d of the fourth connection electrode CNE4.

The first electrode portion CNE5_4a of the fifth connection electrode CNE5_4 may extend in the second direction DR2 from a second side of the middle portion CNE5_4e in the first direction DR1 toward the second side in the second direction DR2. The first electrode portion CNE5_4a may contact the second ends of the fourth light emitting elements ED4 arranged in a first portion EA4a of the fourth lane EA4.

The second electrode portion CNE5_4b of the fifth connection electrode CNE5_4 may extend in the second direction DR2 from a first side of the middle portion CNE5_4e in the first direction DR1 toward the second side in the second direction DR2. The second electrode portion CNE5_4b may contact the second ends of the fourth light emitting elements ED4 arranged in a second portion EA4b of the fourth lane EA4.

The first electrode portion CNE5_4a and the second electrode portion CNE5_4b of the fifth connection electrode CNE5_4 may be spaced from each other by a second width w2 in the first direction DR1, like those of the fourth connection electrode CNE4. The second width w2 may be greater than a third width w3 between the third electrode portion CNE4c and the fourth electrode portion CNE4d of the fourth connection electrode CNE4. Accordingly, the third electrode portion CNE4c and the fourth electrode portion CNE4d of the fourth connection electrode CNE4 may be disposed in a space between the first electrode portion CNE5_4a and the second electrode portion CNE5_4b of the fifth connection electrode CNE5_4. For example, the first electrode portion CNE5_4a of the fifth connection electrode CNE5_4 may face the third electrode portion CNE4c of the fourth connection electrode CNE4 in the first direction DR1, and the second electrode portion CNE5_4b of the fifth connection electrode CNE5_4 may face the fourth electrode portion CNE4d of the fourth connection electrode CNE4 in the first direction DR1.

The third electrode portion CNE5_4c of the fifth connection electrode CNE5_4 may extend in the second direction DR2 from the second side of the middle portion CNE5_4e in the first direction DR1 toward the first side in the second direction DR2. The third electrode portion CNE5_4c may contact the first ends of the fifth light emitting element ED5 arranged in a first portion EA5a of the fifth lane EA5.

The fourth electrode portion CNE5_4d of the fifth connection electrode CNE5_4 may extend in the second direction DR2 from the first side of the middle portion CNE5_4e in the first direction DR1 toward the first side in the second direction DR2. The fourth electrode portion CNE5_4d may contact the first ends of the fifth light emitting elements ED5 arranged in a second portion EA5b of the fifth thread EA5.

The third electrode portion CNE5_4c and the fourth electrode portion CNE5_4d of the fifth connection electrode CNE5_4 may be spaced from each other by the third width w3 (see FIG. 8) in the first direction DR1, like those of the fourth connection electrode CNE4. The third width w3 may be smaller than the second width w2. In one or more embodiments, the third width w3 may be substantially equal to a first width w1, but the present disclosure is not limited thereto.

A space between the third electrode portion CNE5_4c and the fourth electrode portion CNE5_4d may overlap a space between the first electrode portion CNE5_4a and the second electrode portion CNE5_4b in the second direction DR2. For example, the third electrode portion CNE5_4c and the fourth electrode portion CNE5_4d may overlap the space between the first electrode portion CNE5_4a and the second electrode portion CNE5_4b in the second direction DR2.

The sixth connection electrode CNE6 may contact second ends of the fifth light emitting elements ED5 disposed in the fifth lane EA5 and first ends of the sixth light emitting elements ED6 disposed in a sixth lane EA6. The sixth connection electrode CNE6 may include a first electrode portion CNE6a, a second electrode portion CNE6b, a third electrode portion CNE6c, a fourth electrode portion CNE6d, and a middle portion CNE6e.

The middle portion CNE6e of the sixth connection electrode CNE6 may extend in the first direction DR1 within the emission area EMA. At least a portion of the middle portion CNE6e may face the third electrode portion CNE5_4c and the fourth electrode portion CNE5_4d of the fifth connection electrode CNE5_4 in the second direction DR2. A width of the middle portion CNE6e in the first direction DR1 may be greater than the third width w3 between the third electrode portion CNE5_4c and the fourth electrode portion CNE5_4d of the fifth connection electrode CNE5_4.

The first electrode portion CNE6a of the sixth connection electrode CNE6 may extend in the second direction DR2 from a second side of the middle portion CNE6e in the first direction DR1 toward the second side in the second direction DR2. The first electrode portion CNE6a may contact the second ends of the fifth light emitting elements ED5 arranged in the first portion EA5a of the fifth lane EA5.

The second electrode portion CNE6b of the sixth connection electrode CNE6 may extend in the second direction DR2 from a first side of the middle portion CNE6e in the first direction DR1 toward the second side in the second direction DR2. The second electrode portion CNE6b may contact the second ends of the fifth light emitting elements ED5 arranged in the second portion EA5b of the fifth lane EA5.

The first electrode portion CNE6a and the second electrode portion CNE6b of the sixth connection electrode CNE6 may be spaced from each other by the second width w2 in the first direction DR1, like those of the second connection electrode CNE2. The second width w2 may be greater than the third width w3 between the third electrode portion CNE5_4c and the fourth electrode portion CNE5_4d of the fifth connection electrode CNE5_4. Accordingly, the third electrode portion CNE5_4c and the fourth electrode portion CNE5_4d of the fifth connection electrode CNE5_4 may be disposed in a space between the first electrode portion CNE6a and the second electrode portion CNE6b of the sixth connection electrode CNE6. For example, the first electrode portion CNE6a of the sixth connection electrode CNE6 may face the third electrode portion CNE5_4c of the fifth connection electrode CNE5_4 in the first direction DR1, and the second electrode portion CNE6b of the sixth connection electrode CNE6 may face the fourth electrode portion CNE5_4d of the fifth connection electrode CNE5_4 in the first direction DR1.

The third electrode portion CNE6c of the sixth connection electrode CNE6 may extend in the second direction DR2 from the second side of the middle portion CNE6e in the first direction DR1 toward the first side in the second direction DR2. The third electrode portion CNE6c may contact the first ends of the sixth light emitting elements ED6 arranged in a first portion EA6a of the sixth lane EA6.

The fourth electrode portion CNE6d of the sixth connection electrode CNE6 may extend in the second direction DR2 from the first side of the middle portion CNE6e in the first direction DR1 toward the first side in the second direction DR2. The fourth electrode portion CNE6d may contact the first ends of the sixth light emitting elements ED6 arranged in a second portion EA6b of the sixth lane EA6.

The third electrode portion CNE6c and the fourth electrode portion CNE6d of the sixth connection electrode CNE6 may be spaced from each other by the third width w3 in the first direction DR1, like those of the second connection electrode CNE2. The third width w3 may be smaller than the second width w2. In one or more embodiments, the third width w3 may be substantially equal to the first width w1, but the present disclosure is not limited thereto.

A space between the third electrode portion CNE6c and the fourth electrode portion CNE6d may overlap a space between the first electrode portion CNE6a and the second electrode portion CNE6b in the second direction DR2. For example, the third electrode portion CNE6c and the fourth electrode portion CNE6d may overlap the space between the first electrode portion CNE6a and the second electrode portion CNE6b in the second direction DR2.

The seventh connection electrode CNE7 according to the current embodiment may have the third type shape branching to both sides in the first direction DR1 on the second side in the second direction DR2. The seventh connection electrode CNE7 may contact second ends of the sixth light emitting elements ED6 disposed in the sixth lane EA6. The seventh connection electrode CNE7 may include a second power contact portion CNE7d, a first electrode portion CNE7a, a second electrode portion CNE7b, and a branch portion CNE7c.

The second power contact portion CNE7d of the seventh connection electrode CNE7 may generally extend in the second direction DR2. The second power contact portion CNE7d may extend across an outer bank BNL to a sub-area SA.

The second power contact portion CNE7d may be electrically connected to a third alignment electrode RME3 through a second contact portion CT2. Because a second power supply voltage is applied to the third alignment electrode RME3 as described above, it may also be applied to the seventh connection electrode CNE7. Accordingly, the second power voltage may be applied to the second ends of the sixth light emitting elements ED6 arranged in the sixth lane EA6.

In one or more embodiments, the second contact portion CT2 may be disposed in the sub-area SA, but the present disclosure is not limited thereto.

The branch portion CNE7c of the seventh connection electrode CNE7 may be disposed on a second side of the second power contact portion CNE7d in the second direction DR2 and may generally extend in the first direction DR1. In one or more embodiments, the second power contact portion CNE7d may be disposed at an end of the branch portion CNE7c on the first side in the first direction DR1, but the present disclosure is not limited thereto.

The first electrode portion CNE7a of the seventh connection electrode CNE7 may extend in the second direction DR2 from a second side of the branch portion CNE7c in the first direction DR1 toward the second side in the second direction DR2. The first electrode portion CNE7a may be disposed on a first side of a first alignment electrode RME1 in the first direction DR1 to contact the second ends of the sixth light emitting elements ED6 arranged in the first portion EA6a of the sixth lane EA6.

The second electrode portion CNE7b of the seventh connection electrode CNE7 may extend in the second direction DR2 from a first side of the branch portion CNE7c in the first direction DR1 toward the second side in the second direction DR2. The second electrode portion CNE7b may be disposed on a second side of the third alignment electrode RME3 in the first direction DR1 to contact the second ends of the sixth light emitting elements ED6 arranged in the second portion EA6b of the sixth lane EA6.

The first electrode portion CNE7a and the second electrode portion CNE7b may be spaced from each other in the first direction DR1. For example, the first electrode portion CNE7a and the second electrode portion CNE7b may be spaced from each other by a fourth width w4 in the first direction DR1. The fourth width w4 may be greater than the third width w3 between the third electrode portion CNE6c and the fourth electrode portion CNE6d of the sixth connection electrode CNE6.

The third electrode portion CNE6c and the fourth electrode portion CNE6d of the sixth connection electrode CNE6 may be disposed in a space between the first electrode portion CNE7a and the second electrode portion CNE7b of the seventh connection electrode CNE7. For example, the first electrode portion CNE7a of the seventh connection electrode CNE7 may face the third electrode portion CNE6c of the sixth connection electrode CNE6 in the first direction DR1, and the second electrode portion CNE7b of the seventh connection electrode CNE7 may face the fourth electrode portion CNE6d of the sixth connection electrode CNE6 in the first direction DR1.

In the display device 1_4 according to the current embodiment, the first through sixth light emitting elements ED1 through ED6 may be connected in series. In the display device 1_4 according to the current embodiment as compared with the display device 1 according to the embodiment of FIG. 6, series connection relationships of the light emitting elements ED can be easily increased only by changing the number of connection electrodes of the second type shape.

In a display device according to one or more embodiments, lighting reliability of pixels can be improved.

However, the effects, aspects, and features of the embodiments of the present disclosure are not restricted to the one set forth herein. The above and other effects, aspects, and features of the present disclosure will become more apparent to one of daily skill in the art to which the present disclosure pertains by referencing the claims.

In concluding the detailed description, those skilled in the art will appreciate that many variations and modifications can be made to the described embodiments without substantially departing from the principles and scope of the present disclosure. Therefore, the described embodiments of the present disclosure are used in a generic and descriptive sense only and not for purposes of limitation.

What is claimed is:

1. A display device comprising:
a plurality of light emitting elements, each of the plurality of light emitting elements comprising a first end having a first polarity and a second end having a second polarity different from the first polarity; and
a first type connection electrode contacting the first ends and/or the second ends of the light emitting elements,
wherein the first type connection electrode comprises:
a middle portion extending in a first direction;
a first electrode portion extending from the middle portion toward a first side in a second direction intersecting the first direction;
a second electrode portion extending from the middle portion toward the first side in the second direction and spaced from the first electrode portion by a first width in the first direction;
a third electrode portion extending from the middle portion toward a second side in the second direction; and
a fourth electrode portion extending from the middle portion toward the second side in the second direction and spaced from the third electrode portion by a second width in the first direction,
wherein the first width is greater than the second width, and a space between the first electrode portion and the second electrode portion overlaps a space between the third electrode portion and the fourth electrode portion in the second direction.

2. The display device of claim 1, further comprising:
a second type connection electrode configured to apply a first power supply voltage to the first end of at least one of the plurality of light emitting elements; and
a third type connection electrode configured to apply a second power supply voltage having a different potential value from the first power supply voltage to the second end of at least one of the plurality of light emitting elements,
wherein the second type connection electrode and the third type connection electrode are spaced from each other in the second direction, and the first type connection electrode is between the second type connection electrode and the third type connection electrode.

3. The display device of claim 2, wherein the first type connection electrode comprising the first type connection electrodes repeatedly arranged along the second direction between the second type connection electrode and the third type connection electrode.

4. The display device of claim 3, wherein the first type connection electrodes comprise a first connection electrode and a second connection electrode neighboring the first connection electrode in the second direction,
wherein a third electrode portion and a fourth electrode portion of the first connection electrode are between a first electrode portion and a second electrode portion of the second connection electrode,
wherein the third electrode portion of the first connection electrode faces the first electrode portion of the second connection electrode in the first direction, and
wherein the fourth electrode portion of the first connection electrode faces the second electrode portion of the second connection electrode in the first direction.

5. The display device of claim 4, wherein the first connection electrode and the second connection electrode are at different layers.

6. The display device of claim 5, wherein the first connection electrode and the second connection electrode are alternately and repeatedly arranged along the second direction.

7. The display device of claim 2, wherein the second type connection electrode comprises:
a first power portion configured to receive the first power supply voltage; and
a first electrode portion and a second electrode portion branching from the first power portion, extending in the second direction, and spaced from each other in the first direction.

8. The display device of claim 7, wherein the third type connection electrode comprises:
a second power portion configured to receive the second power supply voltage; and
a first electrode portion and a second electrode portion branching from the second power portion, extending in the second direction, and spaced from each other in the first direction.

9. The display device of claim 8, wherein a distance between the first electrode portion and the second electrode portion of the second type connection electrode is equal to the second width, and
wherein a distance between the first electrode portion and the second electrode portion of the third type connection electrode is equal to the first width.

10. The display device of claim 8, wherein the first type connection electrodes comprise a first connection electrode, wherein the first electrode portion and the second electrode portion of the second type connection electrode are between a first electrode portion and a second electrode portion of the first connection electrode, wherein the first electrode portion of the first connection electrode faces the first electrode portion of the second type connection electrode, and wherein the second electrode portion of the first connection electrode faces the second electrode portion of the second type connection electrode.

11. The display device of claim 10, wherein the first type connection electrodes further comprise a second connection electrode spaced from the first connection electrode in the second direction, wherein a third electrode portion and a fourth electrode portion of the second connection electrode are between the first electrode portion and the second electrode portion of the third type connection electrode, wherein the third electrode portion of the second connection electrode faces the first electrode portion of the third type connection electrode, and wherein the fourth electrode portion of the second connection electrode faces the second electrode portion of the third type connection electrode.

12. The display device of claim 11, wherein the first type connection electrodes further comprise a third connection electrode between the first connection electrode and the second connection electrode, wherein a third electrode portion and a fourth electrode portion of the first connection electrode are between a first electrode portion and a second electrode portion of the third connection electrode, and wherein a third electrode portion and a fourth electrode portion of the third connection electrode are between a first electrode portion and a second electrode portion of the second connection electrode.

13. The display device of claim 12, wherein the third electrode portion of the first connection electrode faces the first electrode portion of the third connection electrode, wherein the fourth electrode portion of the first connection electrode faces the second electrode portion of the third connection electrode, wherein the third electrode portion of the third connection electrode faces the first electrode portion of the second connection electrode, and wherein the fourth electrode portion of the third connection electrode faces the second electrode portion of the second connection electrode.

14. The display device of claim 13, wherein the first electrode portion and the second electrode portion of each first type connection electrode contact the second end of at least one of the plurality of light emitting elements, and wherein the third electrode portion and the fourth electrode portion of each first type connection electrode contact the first end of at least one of the plurality of light emitting elements.

15. The display device of claim 14, wherein the plurality of light emitting elements comprises a first light emitting element, a second light emitting element, a third light emitting element, and a fourth light emitting element spaced from each other in the second direction, wherein the first end of the first light emitting element contacts at least one of the first electrode portion and the second electrode portion of the second type connection electrode, wherein the first end of the second light emitting element contacts at least one of the third electrode portion and the fourth electrode portion of the first connection electrode, wherein the first end of the third light emitting element contacts at least one of the third electrode portion and the fourth electrode portion of the third connection electrode, and wherein the first end of the fourth light emitting element contacts at least one of the third electrode portion and the fourth electrode portion of the second connection electrode.

16. A display device comprising:

a first alignment electrode, a second alignment electrode, and a third alignment electrode extending in a first direction and spaced from each other and sequentially arranged along a second direction intersecting the first direction;

a plurality of light emitting elements located at spaces between the first alignment electrode, the second alignment electrode, and the third alignment electrode and each comprising a first end having a first polarity and a second end having a second polarity different from the first polarity; and a plurality of connection electrodes contacting the first ends and/or the second ends of the light emitting elements, wherein the plurality of light emitting elements comprises:

a first light emitting element and a second light emitting element between the first alignment electrode and the second alignment electrode and spaced from each other in the first direction; and a third light emitting element and a fourth light emitting element between the second alignment electrode and the third alignment electrode and spaced from each other in the first direction, wherein the first end of the first light emitting element is electrically connected to the first end of the third light emitting element by one of the plurality of connection electrodes, and the second end of the first light emitting element is electrically connected to the first end of the second light emitting element and the first end of the fourth light emitting element by one of the plurality of connection electrodes.

17. The display device of claim 16, wherein the second end of the third light emitting element is electrically connected to the first end of the second light emitting element and the first end of the fourth light emitting element by one of the plurality of connection electrodes.

18. The display device of claim 17, wherein the plurality of light emitting elements is arranged along the first direction as a column between the first alignment electrode and the second alignment electrode and is arranged along the first direction as a column between the second alignment electrode and the third alignment electrode.

19. The display device of claim 18, wherein a distance between the first alignment electrode and the second alignment electrode is 1 μm to 10 μm, and a distance between the second alignment electrode and the third alignment electrode is 1 μm to 10 μm.

20. The display device of claim 19, wherein at least any one of the plurality of connection electrodes comprises:

a middle portion extending in the second direction;

a first electrode portion extending from the middle portion toward a first side in the first direction;

a second electrode portion extending from the middle portion toward the first side in the first direction and spaced from the first electrode portion by a first width in the second direction;

a third electrode portion extending from the middle portion toward a second side in the first direction; and a fourth electrode portion extending from the middle portion toward the second side in the first direction and spaced from the third electrode portion by a second width in the second direction, wherein the first width is greater than the second width, and a space between the first electrode portion and the second electrode portion overlaps a space between the third electrode portion and the fourth electrode portion in the first direction.

* * * * *